(12) United States Patent
Chen et al.

(10) Patent No.: US 7,742,328 B2
(45) Date of Patent: Jun. 22, 2010

(54) METHOD AND SYSTEM FOR PROVIDING SPIN TRANSFER TUNNELING MAGNETIC MEMORIES UTILIZING NON-PLANAR TRANSISTORS

(75) Inventors: Eugene Chen, Fremont, CA (US);
Yiming Huai, Pleasanton, CA (US);
Alexander A. G. Driskill-Smith, Mountain View, CA (US)

(73) Assignee: Grandis, Inc., Milpitas, CA (US)

( * ) Notice: Subject to any disclaimer, the term of this patent is extended or adjusted under 35 U.S.C. 154(b) by 217 days.

(21) Appl. No.: 11/764,057

(22) Filed: Jun. 15, 2007

(65) Prior Publication Data

US 2008/0310213 A1   Dec. 18, 2008

(51) Int. Cl.
    *G11C 11/00* (2006.01)
(52) U.S. Cl. .................. 365/158; 365/148; 365/72; 977/935
(58) Field of Classification Search .......... 365/66, 365/80–85, 100, 148, 158, 171, 173, 225.5, 365/243.5; 257/421, E21.665; 438/3; 977/933–935
See application file for complete search history.

(56) References Cited

U.S. PATENT DOCUMENTS

| | | | |
|---|---|---|---|
| 6,541,792 B1 | 4/2003 | Tran et al. | |
| 6,940,747 B1 | 9/2005 | Sharma et al. | |
| 7,009,877 B1 * | 3/2006 | Huai et al. | 365/171 |
| 2003/0184919 A1 * | 10/2003 | Lin et al. | 360/314 |
| 2005/0061658 A1 * | 3/2005 | Lin et al. | 204/192.2 |
| 2005/0148137 A1 * | 7/2005 | Brask et al. | 438/216 |
| 2005/0174702 A1 * | 8/2005 | Gill | 360/324.2 |
| 2005/0199913 A1 | 9/2005 | Hofmann et al. | |
| 2006/0141640 A1 * | 6/2006 | Huai et al. | 438/3 |
| 2007/0097730 A1 | 5/2007 | Chen et al. | |

OTHER PUBLICATIONS

PCT International Search Report and Written Opinion of the International Searching Authority, issued Sep. 10, 2008, application No. PCT/US08-66857.
H.-S.P. Wong, "Beyond the conventional transistor", IBM Journal of Research and Development, vol. 46, No. 2/3, Mar./May 2002.
Thomas Skotnicki, et al., "The End of CMOS Scaling", IEEE Circuits & Devices Magazine, Jan./Feb. 2005.
Yang-Kyu Choi, et al., "Sub-20nm CMOS FinFET Technologies", IEDM Technical Digest 2001.
Xuejue Huang, et al., "Sub-50 nm P-Channel FinFET", IEEE Transactions on Electron Devices, vol. 48, No. 5, May 2001.
Digh Hisamoto, et al., "A Folded-channel MOSFET for Deep-sub-tenth Micron Era", IEDM Technical Digest 1998.

(Continued)

*Primary Examiner*—Richard Elms
*Assistant Examiner*—Harry W Byrne
(74) *Attorney, Agent, or Firm*—Convergent Law Group LLP

(57) ABSTRACT

A magnetic memory cell and a magnetic memory incorporating the cell are described. The magnetic memory cell includes at least one magnetic element and at least one non-planar selection device. The magnetic element(s) are programmable using write current(s) driven through the magnetic element. The magnetic memory may include a plurality of magnetic storage cells, a plurality of bit lines corresponding to the plurality of magnetic storage cells, and a plurality of source lines corresponding to the plurality of magnetic storage cells.

20 Claims, 18 Drawing Sheets

OTHER PUBLICATIONS

Digh Hisamoto, et al., "FinFET—A Self-Aligned Double-Gate MOSFET Scalable to 20 nm", IEEE Transactions on Electron Devices, vol. 47, No. 12, Dec. 2000.

Toshiki Saito, et al., "Suppression of Short Channel Effect in Triangular Parallel Wire Channel MOSFETs", IEICE Trans. Electron, vol. E85-C, No. 5, May 2002.

Digh Hisamoto, et al., A Fully Depleted Lean-Channel Transistor (DELTA)—A Novel Vertical Ultrathin SOI MOSFET, IEEE Electron Device Letters, vol. 11, No. 1, Jan. 1990.

PCT International Preliminary Report on Patentability, issued Dec. 17, 2009, application No. PCT/US2008/066857.

* cited by examiner

METHOD AND SYSTEM FOR PROVIDING SPIN TRANSFER TUNNELING MAGNETIC MEMORIES UTILIZING NON-PLANAR TRANSISTORS

BACKGROUND OF THE INVENTION

FIGS. 1-2 depict a small portion of a conventional spin transfer torque random access memory (STT-RAM) 1. FIG. 1 depicts a circuit diagram of the portion of the conventional STT-RAM 1, while FIG. 2 depicts a cross-sectional view of the portion of the conventional STT-RAM 1. The conventional STT-RAM 1 includes a conventional magnetic storage cell 10 including a conventional magnetic element 12 and a conventional selection device 14 that is preferably an isolation transistor 14, word line 24, source line 26, and bit line 28. The source line 26 is shown oriented perpendicular to the bit line 28. However, the source line 26 is typically either parallel or perpendicular to the bit line 28, depending on specific architecture used for the conventional STT-RAM 1.

The conventional magnetic element 12 may be a magnetic tunneling junction (MTJ) or other analogous magnetic element and is configured to be changeable between resistance states by driving a current through the conventional magnetic element 12. The current changes state of the conventional magnetic element 12 using the spin transfer torque switching effect. Typically, this is achieved by ensuring that the conventional magnetic element 12 has a sufficiently small cross-sectional area and that the layers of the magnetic element, such as pinned, spacer and free layer (not separately shown) have particular thicknesses. When the current density is sufficient, the current carriers driven through the conventional magnetic element 12 may impart sufficient torque to change the state of the conventional magnetic element 12. When a write current is driven in one direction, the state may be changed from a low resistance state to a high resistance state. When the write current is driven in the opposite direction, the state may be changed from a high resistance state to a low resistance state.

The conventional selection device 14 is typically a conventional planar transistor, such as a planar MOSFET. The conventional planar transistor 14 includes a conventional source 16, a conventional gate 18, a conventional drain 20, and a conventional gate oxide 22. The conventional source 16 and conventional drain 20 are typically N-doped and reside in a P-well 15 formed within the substrate 13. The conventional planar transistor 14 is termed a "planar" transistor because the conventional gate oxide 22 separating the conventional gate 18 from the P-well 15 is substantially planar. When a threshold voltage is applied to the conventional gate 18 through the conventional word line 24 current can flow between the conventional source 16 and the conventional drain 20. This current may be used in programming the conventional magnetic element 12 via spin transfer.

In order to program the conventional storage cell 10, the conventional word line 24 and thus the conventional planar transistor 14 are activated. A current is driven between the conventional source line 26 and the conventional bit line 28 by supplying a high voltage to the conventional bit line 28 and a low voltage, such as ground, to the conventional source line 26, or vice versa. For a read operation, the bit line 28 and the word line 24 are activated. Consequently, the conventional planar transistor 14 is turned on. A read current is driven through the conventional magnetic element 12. In order to ensure that the conventional storage cell 10 is not written during a read operation, the read current is typically less than the write current. Thus, the conventional magnetic storage cell 10 can be programmed and read.

Although the conventional STT-RAM 1 functions, one of ordinary skill in the art will recognize that there are drawbacks. It is desirable for the conventional STT-RAM 1 to be integrated at higher densities. For the conventional STT-RAM 1 to operate at sufficiently high speeds, it is desirable for the current pulse used to be low. For example, the switching current pulse may be desired to have a width ten nanoseconds or less. However, one of ordinary skill in the art will recognize that the required switching current increases rapidly, particularly for pulse widths below ten nanoseconds. The magnitude of the current through the conventional magnetic element 12 may be limited by the amount of current that can pass through the conventional planar transistor 14. The current passing capability of the conventional planar transistor 14 is proportional to the width of the gate 18. The gate width is measured perpendicular to the cross-section shown in FIG. 2. Thus, the gate width is length of the gate 18 out of the plane of the page in FIG. 2. As the switching current increases, the conventional planar transistor 14 has a larger gate width to support the current. Consequently, it is difficult to fabricate higher density cells 10.

The conventional planar transistor 14 may give rise to other issues as the conventional STT-RAM 1 scales to higher densities. As the gate length, l, scales to smaller sizes, for example from ten microns to fifty nanometers and beyond, the supply voltage decreases. The supply voltage is decreased to account for the reduction in the thickness of the gate oxide 22 at smaller sizes. In addition, the relative transistor leakage power level increases as the technology scales down from 0.25 micron to forty-five nm. For conventional STT-RAM 1 applications, the power leakage generally reaches an unacceptable level for devices having a critical dimension, or gate length, of forty-five nm or less. To compensate for the power leakage, the threshold voltage ($V_t$) of the conventional planar transistor 14 used for memory chips or embedded memories can be increased. This is effective in reducing leakage power in the off state. However, a slightly high $V_t$ may significantly reduce the saturation current of the conventional planar transistor 14. In a conventional STT-RAM cell 10, such a reduction in saturation current means that the write current that may pass through the magnetic element 12 is reduced. The reduction in saturation current may be compensated by using a conventional planar transistor 14 having a much larger gate width. However, a large conventional planar transistor 14 causes the size of the conventional cell 10 to increase. In addition, as discussed above, the supply voltage rapidly decreases as the transistor 14 technology scales down. The transistor drain to source saturation current, the same current that is allowed to pass through the conventional magnetic element 12, depends on the value of the gate voltage ($V_g$). A reduction of $V_g$, for example from 1.5 v to 1.0 v, reduces saturation current to ⅕ of its original value. Consequently, as the supply voltage scales down, the gate width of the conventional planar transistor 14 may be scaled up to supply a sufficient write current for switching the state of the conventional magnetic element 12. Consequently, the conventional cell 10 utilizing the conventional planar transistor 14 may be difficult to scale to higher densities.

Accordingly, what is desired is a method and system for providing and utilizing memory cells employing spin transfer based switching that may be extended to higher densities. The present invention addresses such a need.

BRIEF SUMMARY OF THE INVENTION

A magnetic memory cell and a magnetic memory incorporating the magnetic memory cell are described. The magnetic memory cell includes at least one magnetic element and at least one non-planar selection device. The magnetic element(s) are programmable using write current(s) driven through the magnetic element. The magnetic memory includes a plurality of magnetic storage cells, a plurality of bit lines corresponding to the plurality of magnetic storage cells, and a plurality of source lines corresponding to the plurality of magnetic storage cells.

According to the method and system disclosed herein, the magnetic memory may be integrated to higher densities.

DETAILED DESCRIPTION OF THE INVENTION

Figure 1:
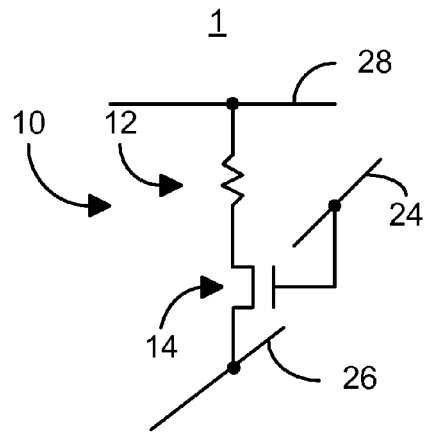
FIG. 1 is a circuit diagram of a portion of a conventional magnetic random access memory employing the spin transfer effect.
Figure 2:
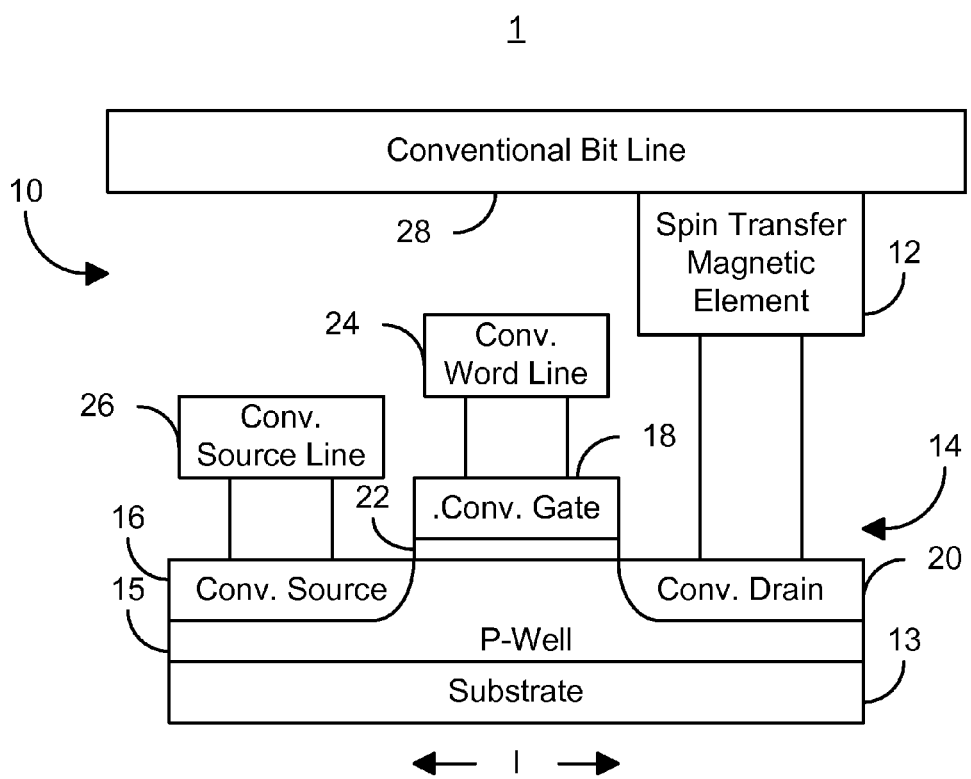
FIG. 2 is a cross-sectional diagram of a portion of a conventional magnetic random access memory employing the spin transfer effect.

The present invention relates to magnetic memories. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention is mainly described in terms of particular systems provided in particular implementations. However, one of ordinary skill in the art will readily recognize that this method and system will operate effectively in other implementations. For example, the non-planar transistors, magnetic storage cells, magnetic elements, and memories may take a number of different forms. For example, the spin transfer magnetic element is depicted as being connected to the drain of the transistor, but need not be so connected in an alternate embodiment. The magnetic memory is also described in the context of a magnetic random access memory (MRAM), but may take other forms. The present invention is also described in the context of writing using spin transfer. One of ordinary skill in the art will recognize that in some embodiments, spin transfer may be used in addition to or in lieu of other writing mechanisms. The present invention will also be described in the context of particular methods having certain steps. However, the method and system operate effectively for other methods having different and/or additional steps not inconsistent with the present invention. One of ordinary skill in the art will also recognize that for clarity, the drawings are not to scale.

Recently, alternative transistor structures that differ from the conventional planar transistor 14 have been developed. These transistors generally include gate oxide structures that do not lie in a single plane (hereinafter non-planar transistors). For example, such transistors might include gate oxide(s) that have at least some component(s) perpendicular to the plane of the underlying substrate and/or may include multiple gate oxide(s) that might have some component(s) perpendicular to the plane of the underlying substrate. Examples of such transistors include but are not limited to a double gate transistor device with the double gate arranged in-plane or perpendicular to the plane of the substrate, with a slab or a strip (fin) of silicon and gate oxide between the gates. Other examples of such non-planar transistors include but are not limited to alternative type(s) of device structures having round gate(s) surrounding a strip or fin of silicon and gate oxide. In general, such non-planar transistors are utilized in semiconductor devices and have had little applicability to magnetic devices. In general such non-planar devices may reduce the leakage current and increase the drain to source saturation current or drive current over the conventional planar transistor 14.

An exemplary embodiment provides a magnetic memory that includes a plurality of magnetic storage cells, a plurality of bit lines corresponding to the plurality of magnetic storage cells, and a plurality of source lines corresponding to the plurality of magnetic storage cells. Each of the magnetic storage cells includes at least one magnetic element and at least one non-planar selection device. The magnetic element(s) are programmable using write current(s) driven through the magnetic element.

Figure 3:
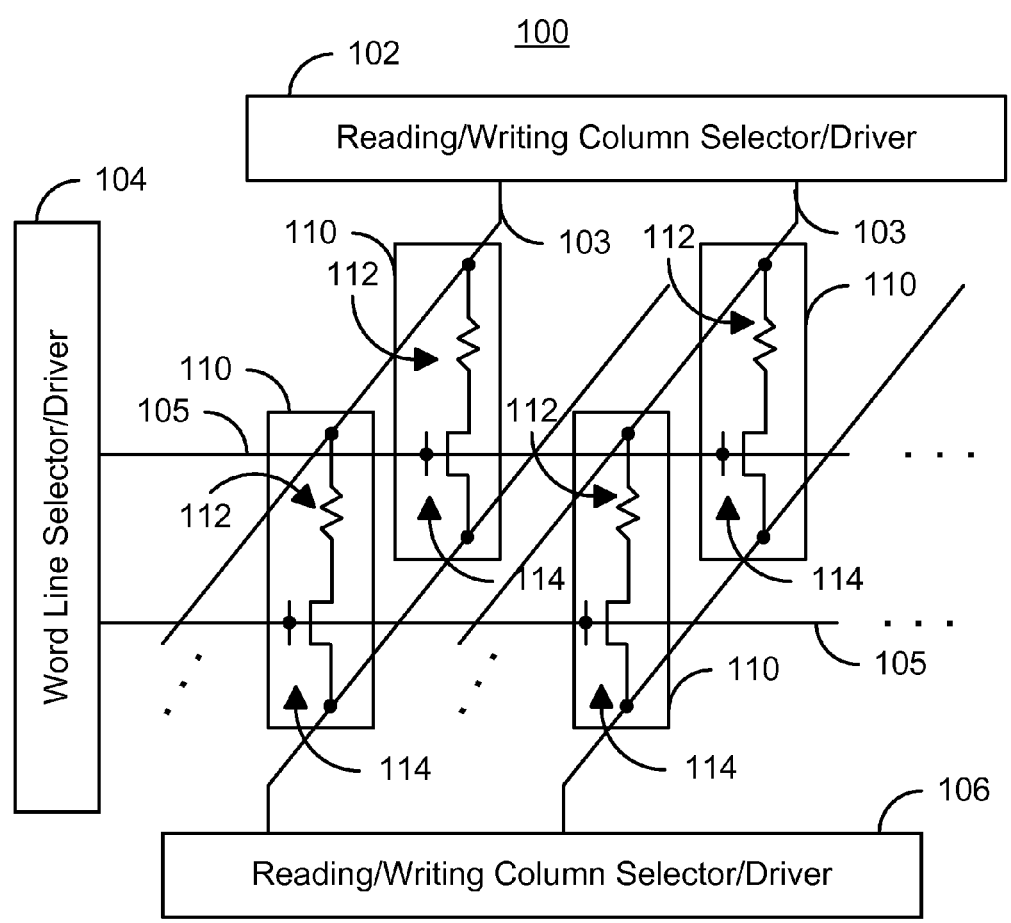
FIG. 3 is a diagram of an exemplary embodiment of a magnetic memory employing the spin transfer effect and non-planar transistors.

FIG. 3 is a diagram of an exemplary embodiment of a magnetic memory 100 employing the spin transfer effect. The magnetic memory 100 is preferably a STT-RAM 100 and includes reading/writing column selector/drivers 102 and 106 as well as word line selector/driver 104. The STT-RAM 100 also includes memory cells 110 including a magnetic element 112 and a non-planar selection device 114. The magnetic element 112 utilizes the spin transfer effect in switching and preferably exhibits a high magnetoresistance and for example may include single or dual spin valves, single or dual magnetic tunneling junctions, and/or ballistic magnetoresistive elements. The reading/writing column selector/drivers 102 and 106 may be used to selectively drive current through the bit lines 103 and thus the cells 110. The word line selector/driver 104 selectively enables row(s) of the STT-RAM 100 by enabling the non-planar transistor 114 coupled with the selected word line 105.

Because the non-planar transistors 114 are used, the leakage current may be reduced. Furthermore, the source-drain saturation current of the non-planar transistors 114 may be increased. As a result, an adequate write current for the magnetic elements 112 may be supported without increasing the size of the non-planar transistors. Consequently, the STT-RAM 100 may be integrated to higher densities.

Figure 4:
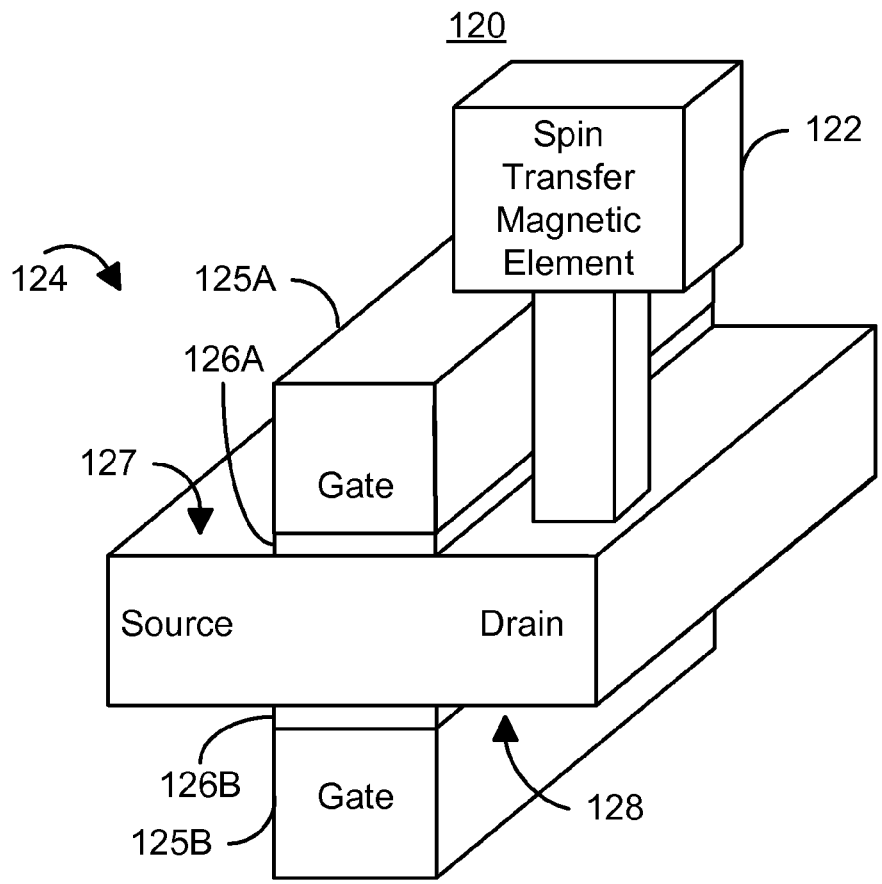
FIGS. 4-24 are diagrams of exemplary embodiments of a magnetic storage cell employing the spin transfer effect and non-planar transistors.

FIGS. 4-24 are diagrams of exemplary embodiments of a magnetic storage cell 120, 130, 140, 150, 160, 170, 180, 190, 200, 210, 220, 230, 240, 250, 260, 270, 280, 290, 300, 310, and 320 employing the spin transfer effect. The magnetic storage cells 120, 130, 140, 150, 160, 170, 180, 190, 200, 210, 220, 230, 240, 250, 260, 270, 280, 290, 300, 310, and 320 may be used for the magnetic storage cells 110 in the magnetic memory. Referring to FIG. 4, the magnetic storage cell 120 includes a magnetic element 122 corresponding to the magnetic element 112 and a non-planar transistor 124 that corresponds to the non-planar selection device 114. The non-planar transistor 124 is a dual gate transistor 124. The non-planar transistor 124 includes source 127, drain 128, gates 125A and 125B, and gate oxides 126A and 126B. Thus, the non-planar transistor includes gate oxides 126A and 126B which, although may be substantially parallel to the plane as the underlying substrate (not shown), do not lie in a single plane.

Figure 5:
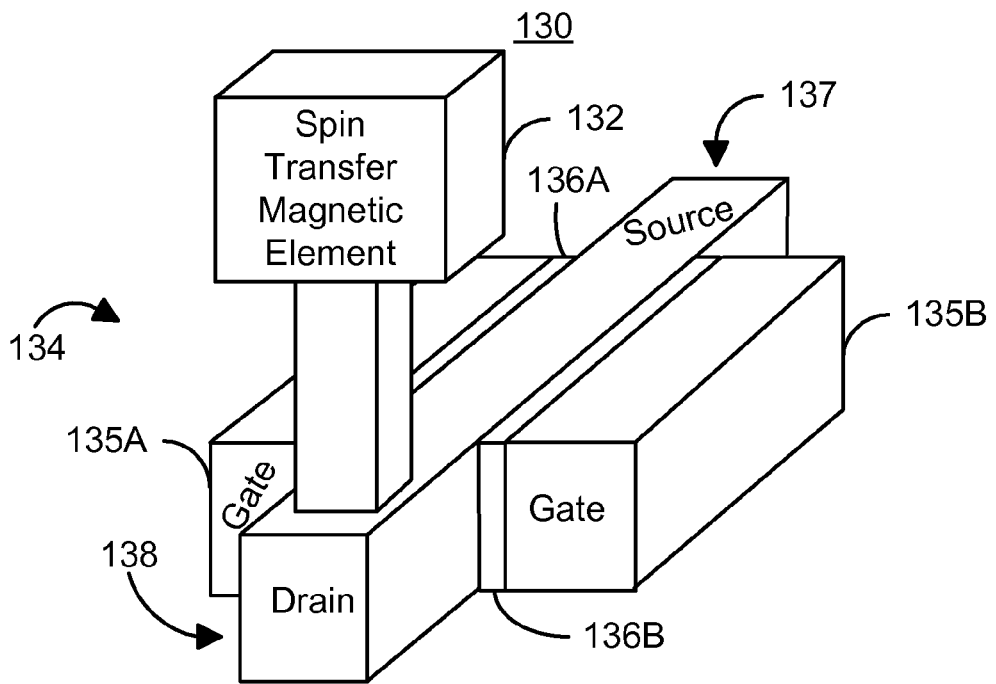

FIG. 5 depicts the magnetic storage cell 130, which includes a magnetic element 132 corresponding to the magnetic element 112 and a non-planar transistor 134 that corresponds to the non-planar selection device 114. The non-planar transistor 134 is a Fin transistor 134. The non-planar transistor 134 includes source 137, drain 138, gates 135A and 135B, and gate oxides 136A and 136B. Thus, the non-planar transistor includes gate oxides 136A and 136B which may lie in a plane substantially perpendicular to the plane of an underlying substrate. The non-planar transistor 134 is termed a Fin transistor because of the slab or strip (fin) of silicon in which the source 137 and drain 138 are formed and the gate oxides 136A and 136B between which the gates 135A and 135B reside.

Figure 6:
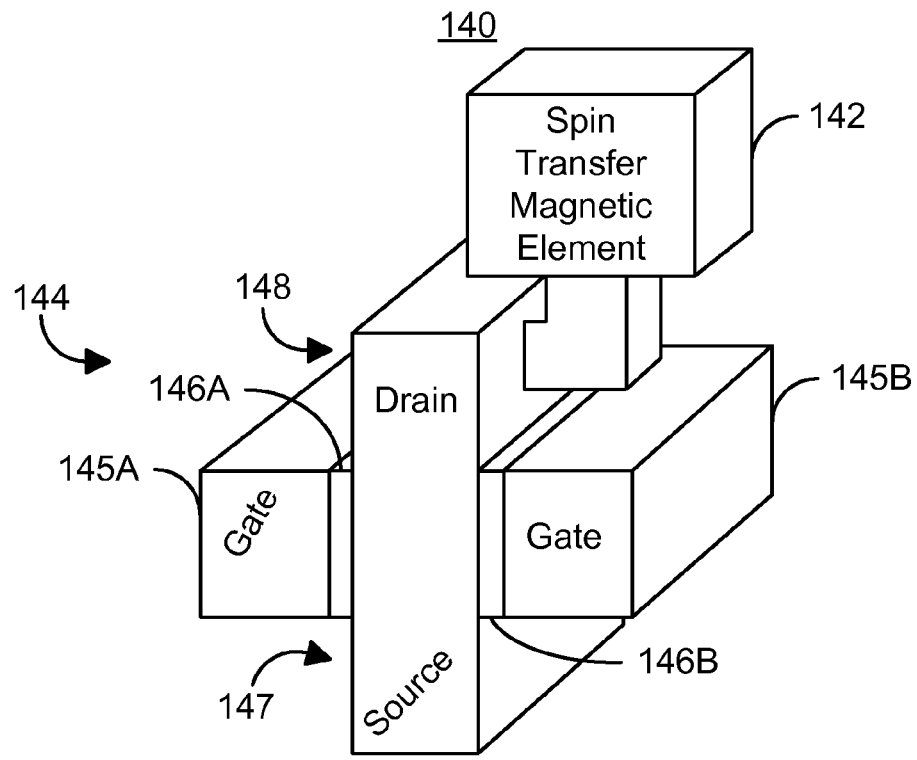

FIG. 6 depicts the magnetic storage cell 140, which includes a magnetic element 142 corresponding to the magnetic element 112 and a non-planar transistor 144 that corresponds to the non-planar selection device 114. The non-planar transistor 144 is a vertical transistor 144. The non-planar transistor 144 includes source 147, drain 148, gates 145A and 145B, and gate oxides 146A and 146B. Thus, the non-planar transistor includes gate oxides 146A and 146B which may lie in a plane substantially perpendicular to the plane of an underlying substrate. The non-planar transistor 144 may be termed a vertical transistor because the source 147 and drain 148 are substantially vertically aligned.

Figure 7:
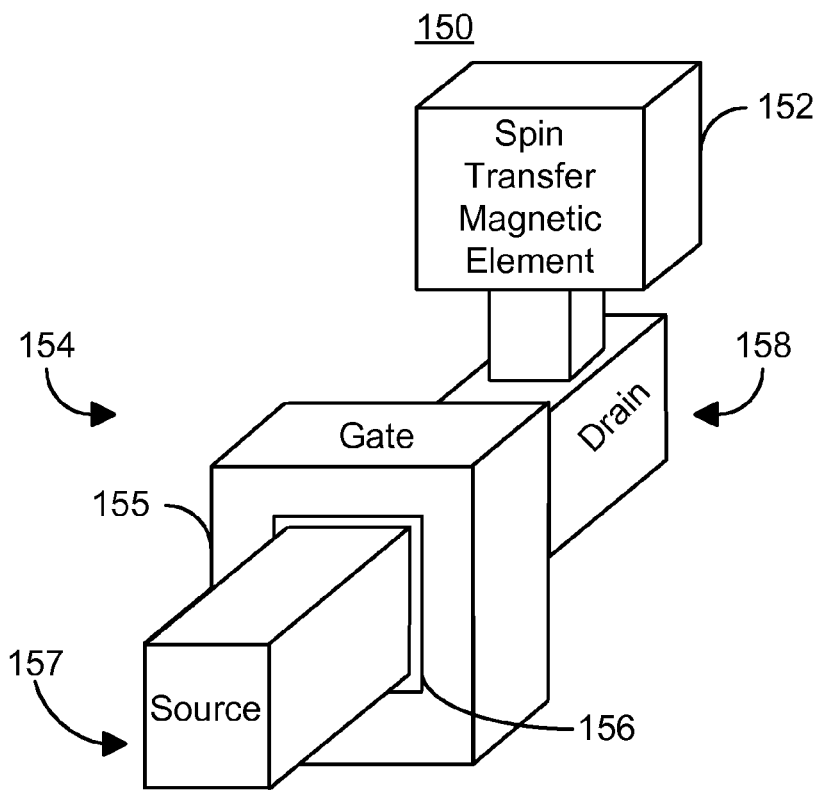

FIG. 7 depicts the magnetic storage cell 150, which includes a magnetic element 152 corresponding to the magnetic element 112 and a non-planar transistor 154 that corresponds to the non-planar selection device 114. The non-planar transistor 154 is a round-gate transistor 154. The non-planar transistor 154 includes source 157, drain 158, gate 155, and gate oxide 156. Thus, the non-planar transistor includes gate oxide 156 which includes components that lie in a plane substantially perpendicular to the plane of an underlying substrate. The non-planar transistor 154 is termed a round-gate transistor because the gate oxide 156 and the gate 155 substantially surround silicon in which the source 157 and drain 158 are formed.

Figure 8:
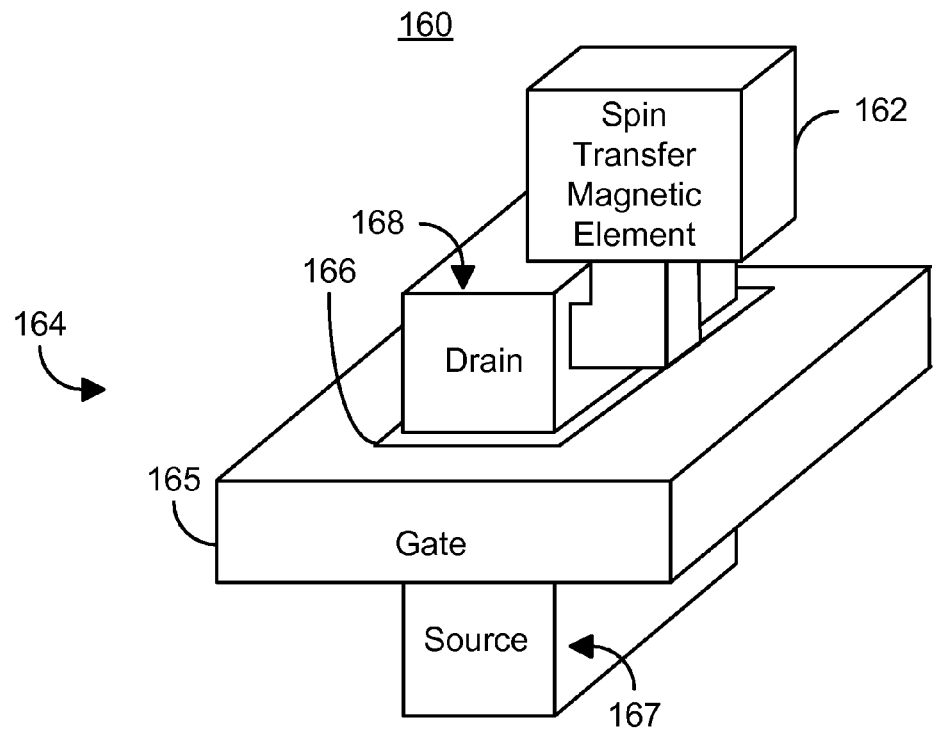

FIG. 8 depicts the magnetic storage cell 160, which includes a magnetic element 162 corresponding to the magnetic element 112 and a non-planar transistor 164 that corresponds to the non-planar selection device 114. The non-planar transistor 164 is another vertical transistor 164. The non-planar transistor 164 includes source 167, drain 168, gate 165, and gate oxide 166. Thus, the non-planar transistor includes gate oxide 166 which, although may lie substantially parallel to the plane as the underlying substrate (not shown), do not lie in a single plane. The non-planar transistor 164 may be termed a vertical transistor because the source 167 and drain 168 are substantially vertically aligned.

Figure 9:
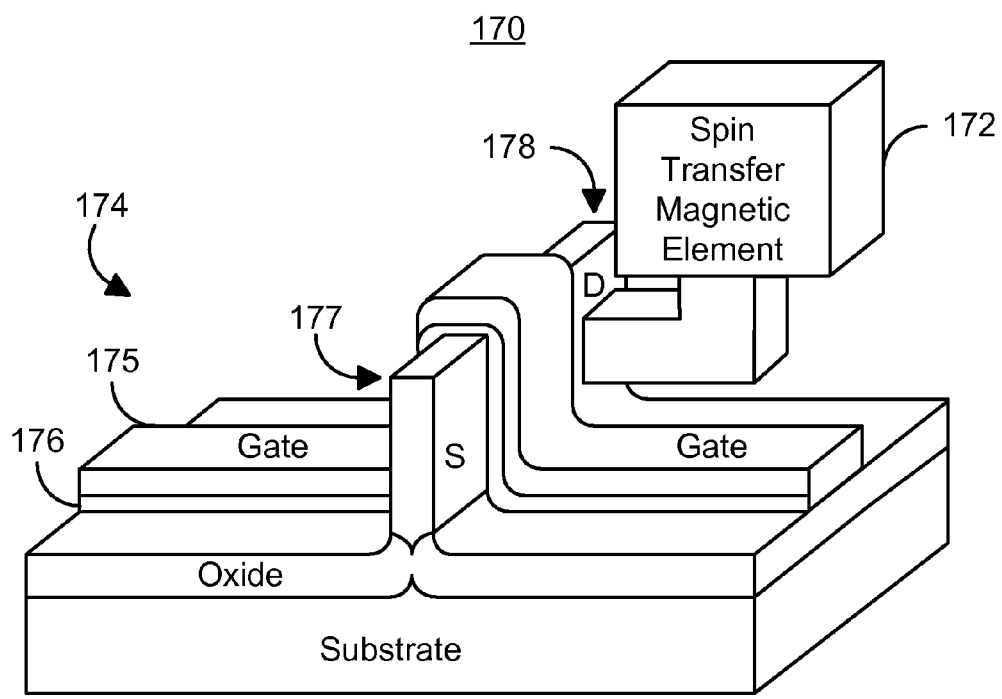

FIG. 9 depicts the magnetic storage cell 170, which includes a magnetic element 172 corresponding to the magnetic element 112 and a non-planar transistor 174 that corresponds to the non-planar selection device 114. The non-planar transistor 174 is analogous to the non-planar transistor (FinFET) 134 depicted in FIG. 5. Referring back to FIG. 9, the non-planar transistor 174 is a delta gate transistor 174. The non-planar transistor 174 includes source 177, drain 178, gate 175, and gate oxide 176. Thus, the non-planar transistor 174 includes gate oxide 176 which may include component(s) that lie in a plane substantially perpendicular to the plane of an underlying substrate.

Figure 10:
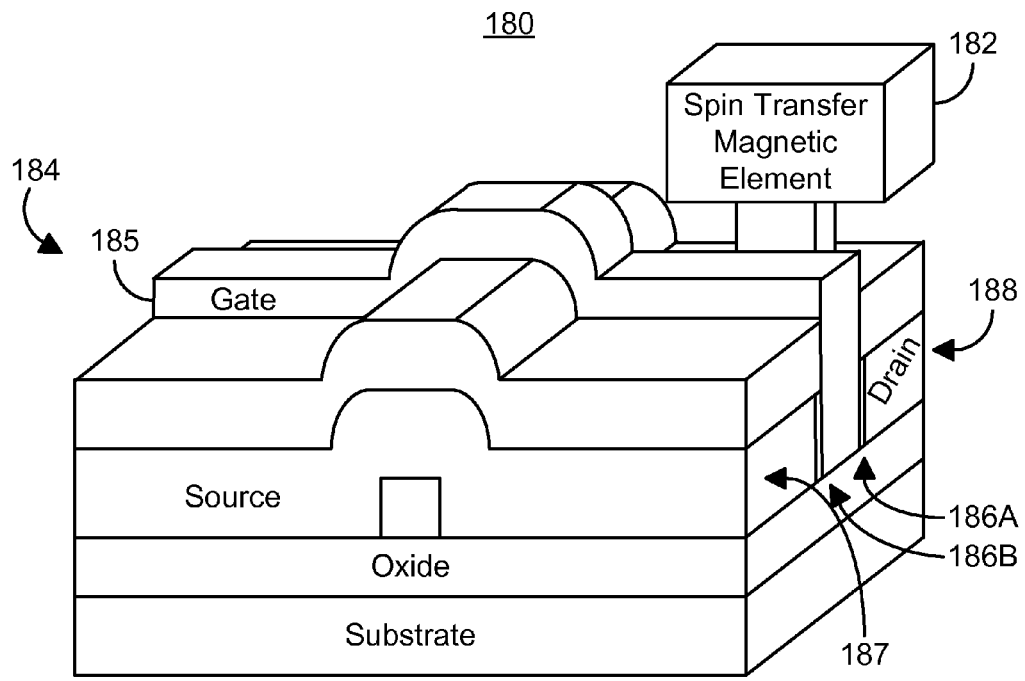

FIG. 10 depicts the magnetic storage cell 180, which includes a magnetic element 182 corresponding to the magnetic element 112 and a non-planar transistor 184 that corresponds to the non-planar selection device 114. The non-planar transistor 184 is analogous to the non-planar transistor (FinFET) 134 depicted in FIG. 5. Referring back to FIG. 10, the non-planar transistor 184 is a folded channel transistor 184. The non-planar transistor 184 includes source 187, drain 188, gate 185, and gate oxides 186A and 186B. Thus, the non-planar transistor 184 includes gate oxides 186A and 186B which may include component(s) that are substantially perpendicular to the plane of an underlying substrate.

Figure 11:
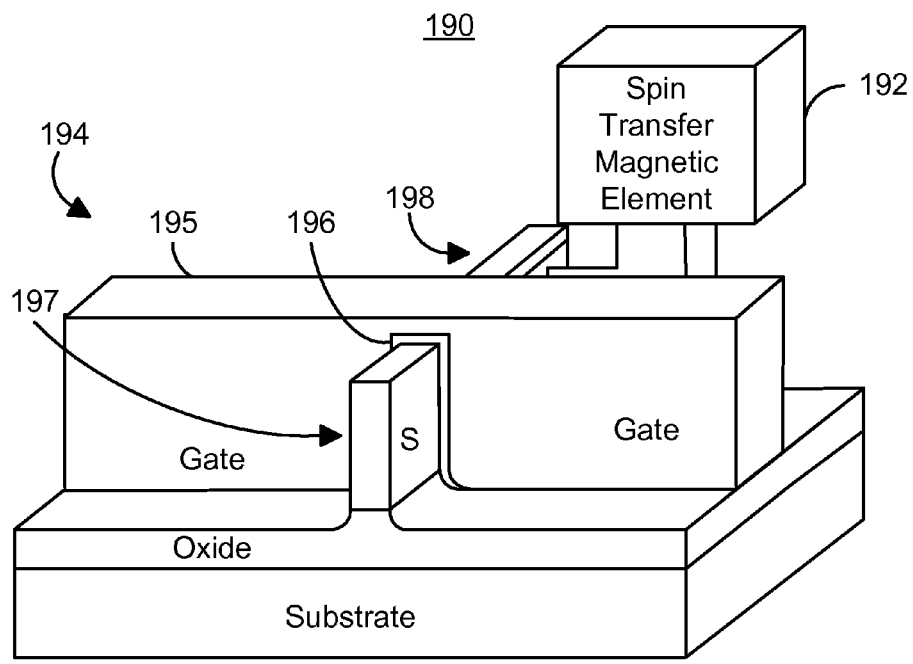

FIG. 11 depicts the magnetic storage cell 190, which includes a magnetic element 192 corresponding to the magnetic element 112 and a non-planar transistor 194 that corresponds to the non-planar selection device 114. The non-planar transistor 194 is analogous to the non-planar transistor (FinFET) 134 depicted in FIG. 5. Referring back to FIG. 11, the non-planar transistor 194 is a vertical source planar gate transistor 194. The vertical source planar gate transistor is so termed because of the configuration of the source and drain. The non-planar transistor 194 includes source 197, drain 198, gate 195, and gate oxide 196. Thus, the non-planar transistor 194 includes gate oxide 196 which may include component(s) that are substantially perpendicular to the plane of an underlying substrate.

Figure 12:
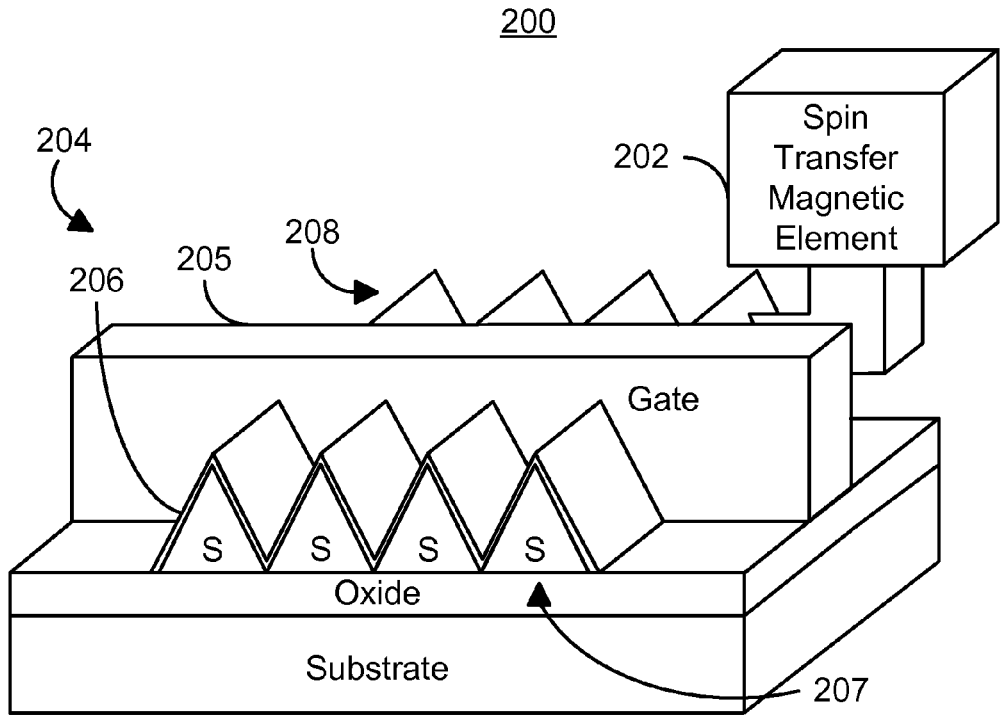

FIG. 12 depicts the magnetic storage cell 200, which includes a magnetic element 202 corresponding to the magnetic element 112 and a non-planar transistor 204 that corresponds to the non-planar selection device 114. The non-planar transistor 204 is a triangular wire transistor 204. The triangular wire transistor 204 is so termed because of the configuration of the source and drain. Although depicted as a triangle, other geometries that may include multiple sources and drains may be possible. For example, the channels need be neither triangular nor adjacent to each other as shown in FIG. 12. The non-planar transistor 204 includes source 207, drain 208, gate 205, and gate oxide 206. Thus, the non-planar transistor 204 includes gate oxide 206 which may include component(s) that are substantially perpendicular to the plane of an underlying substrate.

Figure 13:
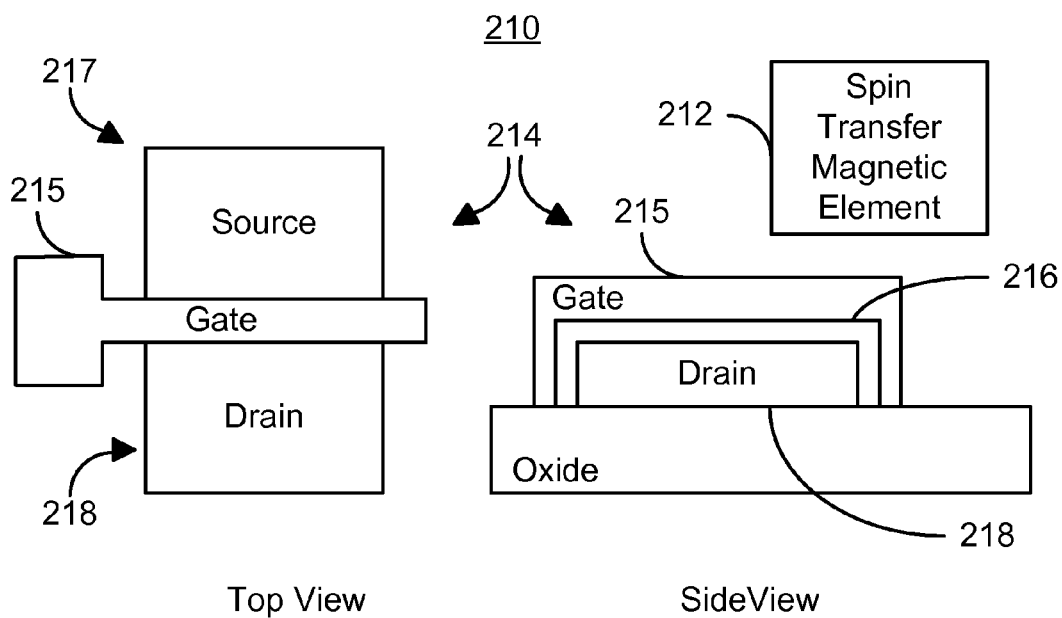

FIG. 13 depicts the magnetic storage cell 210, which includes a magnetic element 212 corresponding to the magnetic element 112 and a non-planar transistor 214 that corresponds to the non-planar selection device 114. Both top and side views of the magnetic storage cell 210 are depicted. The non-planar transistor 214 is a silicon-on-insulator (SOI) transistor 214. The SOI transistor 214 is so termed because of the configuration of the source, drain, and gate. The non-planar transistor 214 includes source 217, drain 218 to which the magnetic element 212 is coupled, gate 215, and gate oxide 216. The SOI transistor 214 is termed a non-planar transistor

214 because gate oxide 216 may include components that are substantially perpendicular to the plane of an underlying substrate. Note that for clarity, connection between the spin transfer magnetic element 212 and the transistor 214 is not shown.

Figure 14:
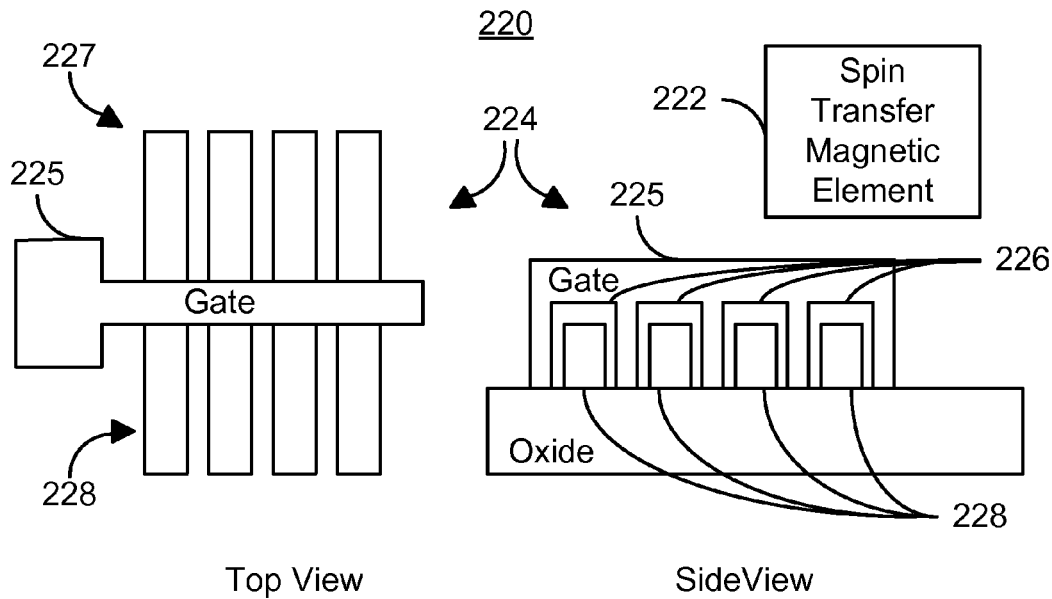

FIG. 14 depicts the magnetic storage cell 220, which includes a magnetic element 222 corresponding to the magnetic element 112 and a non-planar transistor 224 that corresponds to the non-planar selection device 114. Both top and side views of the magnetic storage cell 220 are depicted. The non-planar transistor 224 is a multiple-channel Fin field effect transistor (FinFET) 224, more specifically termed a multiple-channel double-gate-FinFET. The non-planar transistor 224 includes source 227, drain 228, gate 225, and gate oxide 226. The source 227 and drain 228 have multiple components (fins). Thus, the non-planar transistor 224 includes gate oxide 226 which may include components that are substantially perpendicular to the plane of an underlying substrate. Note that for clarity, connection between the spin transfer magnetic element 222 and the transistor 224 is not shown.

Figure 15:
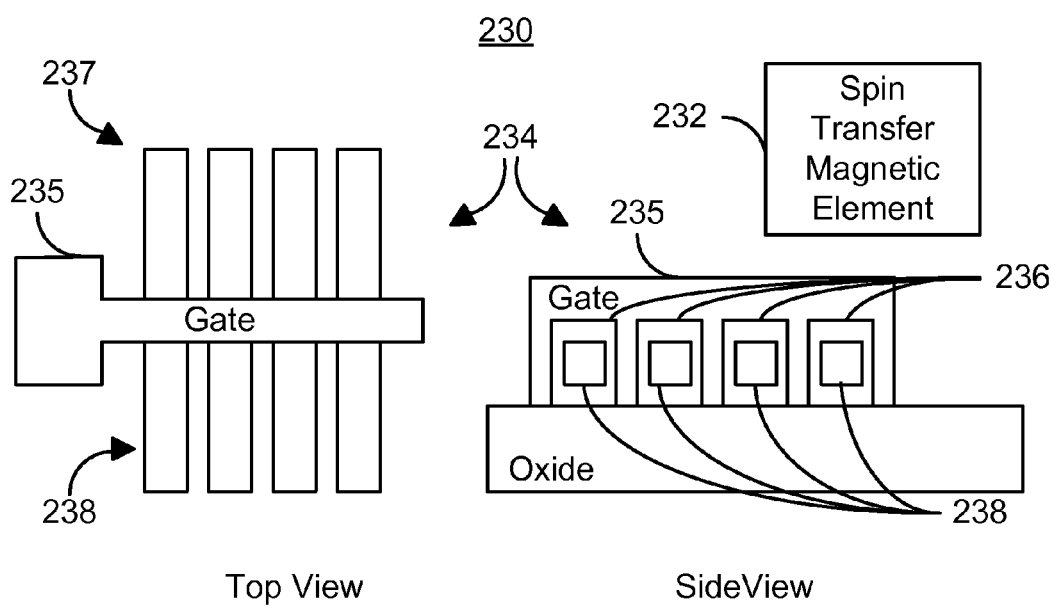

FIG. 15 depicts the magnetic storage cell 230, which includes a magnetic element 232 corresponding to the magnetic element 112 and a non-planar transistor 234 that corresponds to the non-planar selection device 114. Both top and side views of the magnetic storage cell 230 are depicted. The non-planar transistor 234 is also a multiple-channel FinFET 234, more specifically termed a multiple-channel, round-gate-FinFET. The non-planar transistor 234 includes source 237, drain 238, gate 235, and gate oxide 236. The source 237 and drain 238 have multiple components (fins). Thus, the non-planar transistor 234 includes gate oxide 236 which may include components that are substantially perpendicular to the plane of an underlying substrate. Note that for clarity, connection between the spin transfer magnetic element 232 and the transistor 234 is not shown.

Figure 16:
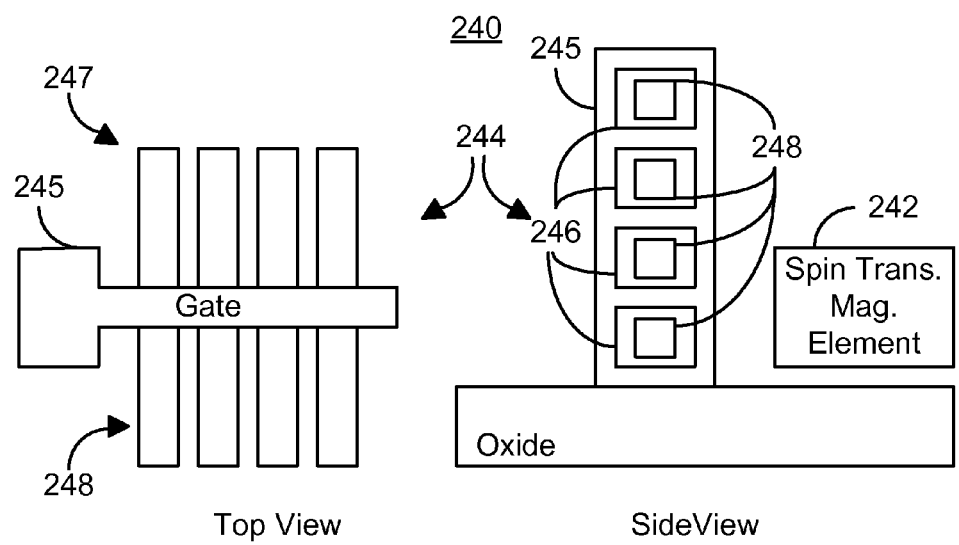

FIG. 16 depicts the magnetic storage cell 240, which includes a magnetic element 242 corresponding to the magnetic element 112 and a non-planar transistor 244 that corresponds to the non-planar selection device 114. Both top and side views of the magnetic storage cell 240 are depicted. The non-planar transistor 244 is also a multiple-channel FinFET 244, more specifically termed a multiple-channel, stacked FinFET. The non-planar transistor 244 includes source 247, drain 248, gate 245, and gate oxide 246. The source 247 and drain 248 have multiple components (fins). Thus, the non-planar transistor 244 includes gate oxide 246 which may include components that are substantially perpendicular to the plane of an underlying substrate. Note that for clarity, connection between the spin transfer magnetic element 242 and the transistor 244 is not shown.

Figure 17:
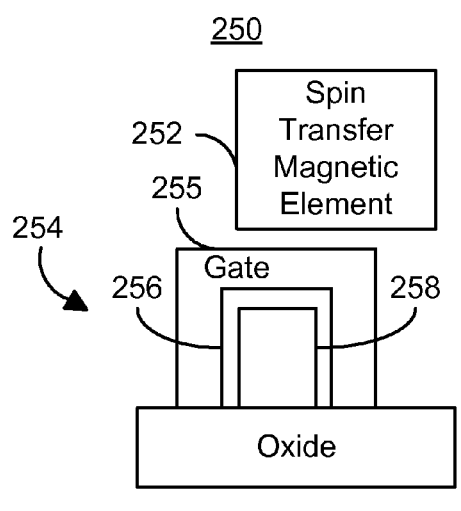

FIG. 17 depicts a side view of the magnetic storage cell 250, which includes a magnetic element 252 corresponding to the magnetic element 112 and a non-planar transistor 254 that corresponds to the non-planar selection device 114. The non-planar transistor 254 is also a SOI transistor 254, more specifically termed a double fin gate SOI transistor. The non-planar transistor 254 includes source (not shown), drain 258, gate 255, and gate oxide 256. The source (not shown) and drain 258 have multiple components (fins), though for simplicity only one is depicted in FIG. 17. Thus, the non-planar transistor 254 includes gate oxide 256 which may include components that are substantially perpendicular to the plane of an underlying substrate. Note that for clarity, connection between the spin transfer magnetic element 252 and the transistor 254 is not shown.

Figure 18:
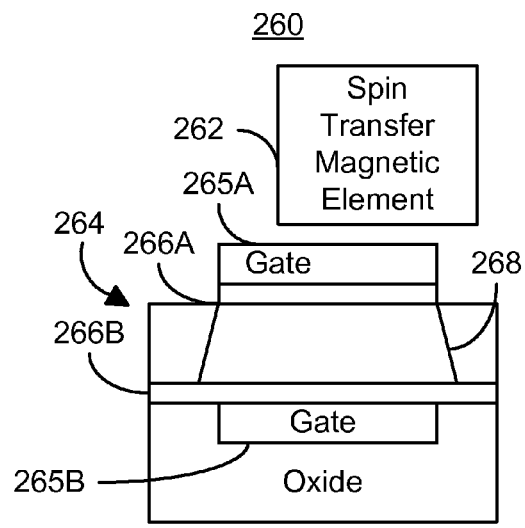

FIG. 18 depicts a side view of the magnetic storage cell 260, which includes a magnetic element 262 corresponding to the magnetic element 112 and a non-planar transistor 264 that corresponds to the non-planar selection device 114. The non-planar transistor 264 is also a SOI transistor 264, more specifically termed a double gate SOI transistor. The non-planar transistor 264 includes source (not shown), drain 268, gates 265A and 265B, and gate oxide 266A and 266B. The non-planar transistor 264 includes gate oxides 266A and 266B which, although substantially parallel to the underlying substrate, do not lie in the same plane. Note that for clarity, connection between the spin transfer magnetic element 262 and the transistor 264 is not shown.

Figure 19:
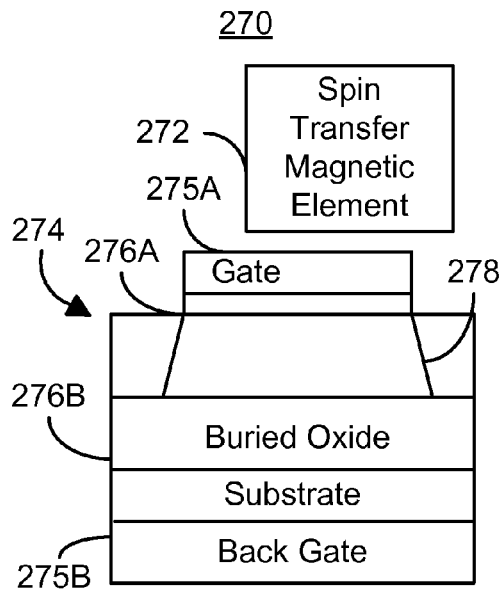

FIG. 19 depicts a side view of the magnetic storage cell 270, which includes a magnetic element 272 corresponding to the magnetic element 112 and a non-planar transistor 274 that corresponds to the non-planar selection device 114. The non-planar transistor 274 is also a SOI transistor 274, more specifically termed a back gate transistor. The non-planar transistor 274 may also be termed a double gate transistor, where one of the gates is a back gate 275B. The non-planar transistor 274 includes source (not shown), drain 278, gates 275A and 275B, and gate oxides 276A and 276B. The back gate 275B may also function as a ground plane. The non-planar transistor 274 includes gate oxides 276A and 276B which, although substantially parallel to the underlying substrate, do not lie in the same plane. For clarity, connection between the spin transfer magnetic element 272 and the transistor 274 is not shown.

Figure 20:
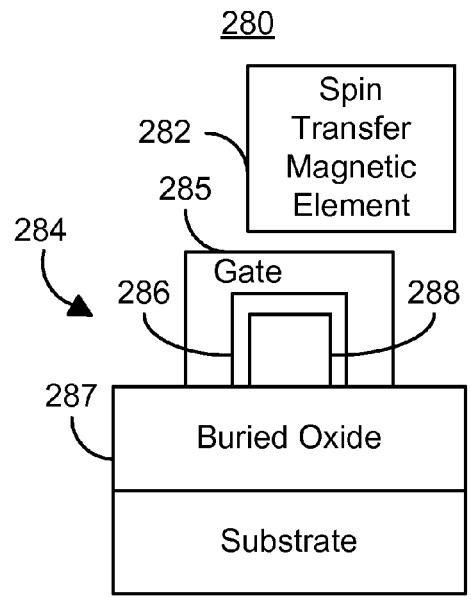

FIG. 20 depicts a side view of the magnetic storage cell 280, which includes a magnetic element 282 corresponding to the magnetic element 112 and a non-planar transistor 284 that corresponds to the non-planar selection device 114. The non-planar transistor 284 is also a SOI transistor 284, more specifically termed a triple gate transistor, or triple SOI FinFET with, in the embodiment shown, three effective gates. The non-planar transistor 284 includes source 287, drain 288, gate 285, and gate oxide 286. The non-planar transistor 284 includes gate oxide 286 which includes component(s) that do not lie in the same plane as the underlying substrate. More specifically, the gate oxide 286 includes components that may be substantially perpendicular to the plane of the underlying substrate. The silicon fin used for the source and drain 288 has a cross section that is approximately square, in contrast to the transistor 254 depicted in FIG. 17. Referring back to FIG. 20, the sides and top of the silicon fin used for the source and drain 288 may thus be considered to have three effective gates. Note that for clarity, connection between the spin transfer magnetic element 282 and the transistor 284 is not shown.

Figure 21:
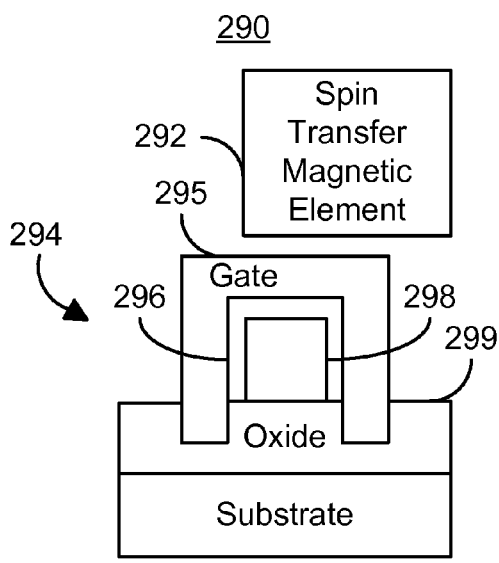

FIG. 21 depicts a side view of the magnetic storage cell 290, which includes a magnetic element 292 corresponding to the magnetic element 112 and a non-planar transistor 294 that corresponds to the non-planar selection device 114. The non-planar transistor 294 is also a SOI transistor 294 that is a triple gate transistor sometimes known as a π or Ω gate transistor. The SOI transistor 294 may be considered analogous to the transistor 284 depicted in FIG. 20, but which extends into the underlying oxide 299. Referring back to FIG. 21, the non-planar transistor 294 includes source 297, drain 298, gate 295, and gate oxide 296. The non-planar transistor 294 includes gate oxide 296 which includes component(s) that do not lie in the same plane as the underlying substrate. More specifically, the gate oxide 296 includes components that may be substantially perpendicular to the plane of the underlying substrate. Note that for clarity, connection between the spin transfer magnetic element 292 and the transistor 294 is not shown.

Figure 22:
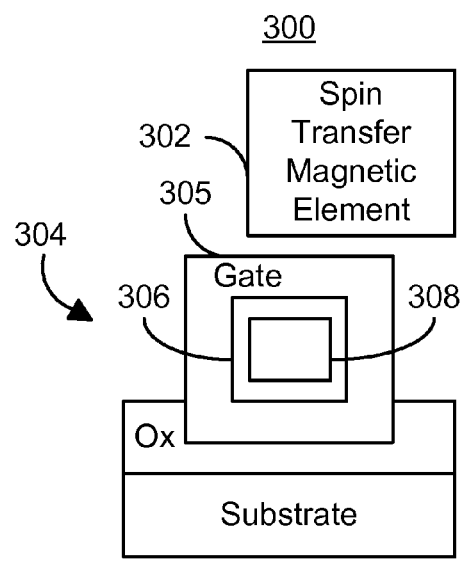

FIG. 22 depicts a side view of the magnetic storage cell 300, which includes a magnetic element 302 corresponding to the magnetic element 112 and a non-planar transistor 304 that corresponds to the non-planar selection device 114. The non-planar transistor 304 is also a SOI transistor 304, also known as a quadruple or surrounding gate transistor. The non-planar transistor 304 includes source 307, drain 308, gate 305, and gate oxide 306. The non-planar transistor 304 includes gate oxide 306 which includes component(s) that do not lie in the same plane as the underlying substrate. More specifically, the gate oxide 306 includes components that may be substantially perpendicular to the plane of the underlying substrate. Note that for clarity, connection between the spin transfer magnetic element 302 and the transistor 304 is not shown.

Figure 23:
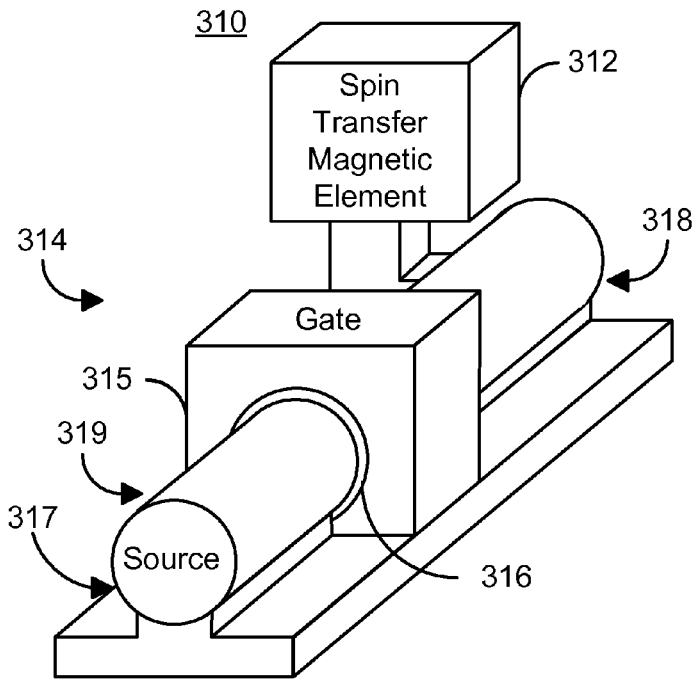

FIG. 23 depicts the magnetic storage cell 310, which includes a magnetic element 312 corresponding to the magnetic element 112 and a non-planar transistor 314 that corresponds to the non-planar selection device 114. The non-planar transistor 314 may be termed a nanowire transistor because the channel is formed of a nanowire 319 that may have a circular cross section, instead of a rectangular cross-section as in a FinFET. The non-planar transistor 314 includes source 317, drain 318, gate 315, gate oxide 316 and nanowire 319. The non-planar transistor 314 includes gate oxide 316 which surrounds the nanowire in which the source 317 and drain 318 are formed. Thus, the gate oxide 316 includes component(s) that do not lie in the same plane as the underlying substrate. More specifically, the gate oxide 316 includes components that may be substantially perpendicular to the plane of the underlying substrate.

Figure 24:
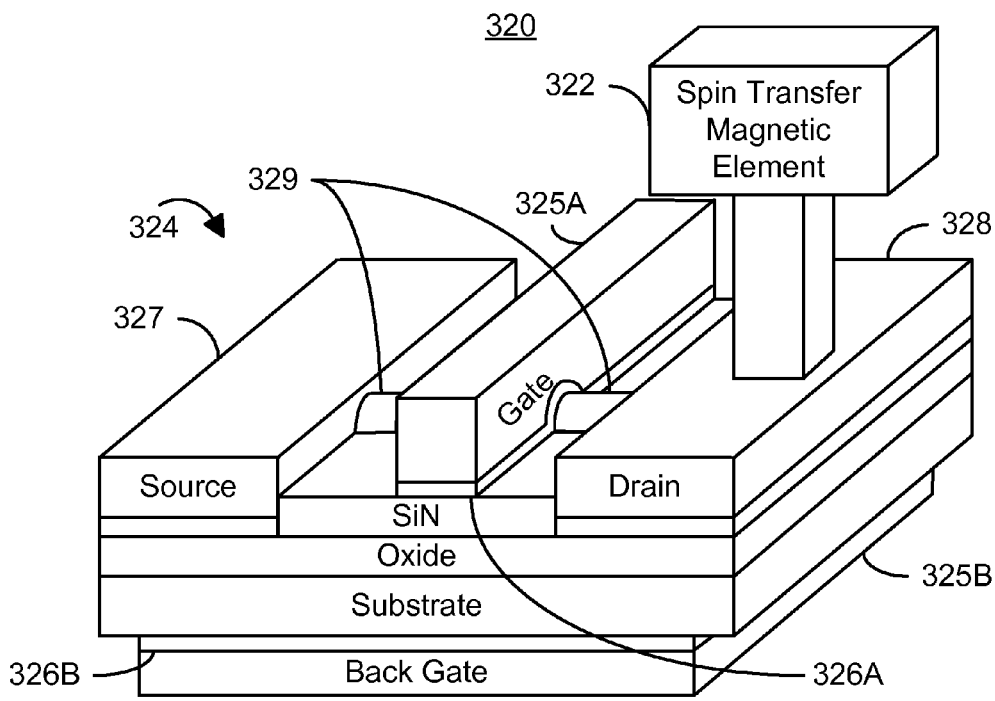

FIG. 24 depicts the magnetic storage cell 320, which includes a magnetic element 322 corresponding to the magnetic element 112 and a non-planar transistor 324 that corresponds to the non-planar selection device 114. The non-planar transistor 324 may also be termed a carbon nanotube transistor 214. The non-planar transistor 324 includes source 327, drain 328, gates 325A and 325B, and gate oxides 326A and 326B. The gate 325B is a back gate. In addition, a carbon nanotube 329 forms the channel between source 327 and drain 328. In another embodiment, multiple carbon nanotubes may form the channel. The non-planar transistor 324 includes gate oxide 326A which surrounds the nanotube. The source 327 and drain 328 are electrically connected to the nanotube. Thus, the gate oxides 326A and 326B include component(s) that do not lie in the same plane as the underlying substrate. More specifically, the gate oxide 326A surrounds the nanotube and thus does not lie in a single plane.

Using the magnetic storage cells 120, 130, 140, 150, 160, 170, 180, 190, 200, 210, 220, 230, 240, 250, 260, 270, 280, 290, 300, 310, 320, and/or another magnetic storage cell (not shown) include non-planar transistor(s) (not shown) that may have reduced leakage and may support a larger current. Consequently, memory cells such as the memory cells 120, 130, 140, 150, 160, 170, 180, 190, 200, 210, 220, 230, 240, 250, 260, 270, 280, 290, 300, 310, and/or 320 may be used at higher speed (which require higher write current pulses using a shorter pulse duration) and at higher densities. Accordingly, the memory cells 120, 130, 140, 150, 160, 170, 180, 190, 200, 210, 220, 230, 240, 250, 260, 270, 280, 290, 300, 310, and/or 320 may be used to provide higher density STT-RAM having improved performance.

Figure 25:
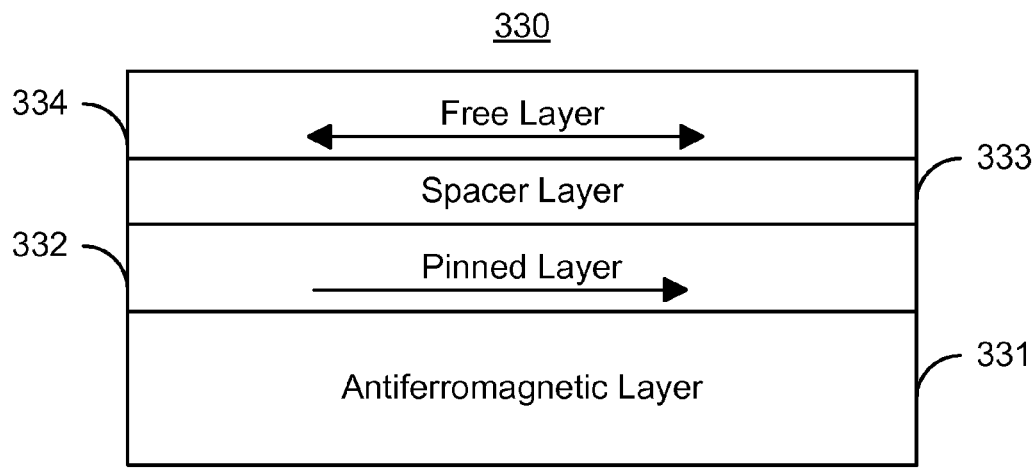
FIGS. 25-26 are diagrams of exemplary embodiments of magnetic elements used in exemplary embodiments of magnetic storage cells employing the spin transfer effect and non-planar transistors.
Figure 26:
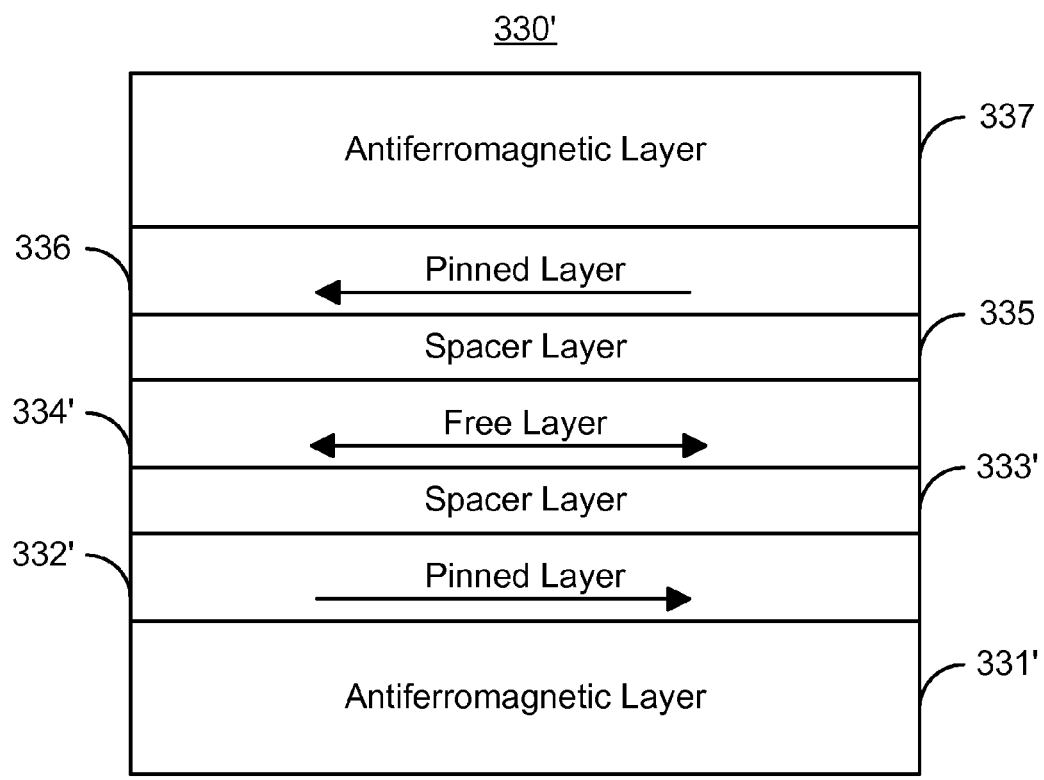

FIGS. 25-26 are diagrams of exemplary embodiments of magnetic elements 330 and 330' used in exemplary embodiments of magnetic storage cells employing the spin transfer effect. Thus, current may be driven through the magnetic elements 330 and 330' in a current perpendicular to plane (CPP) configuration (vertically in FIGS. 25-26). Referring to FIG. 25, the magnetic element includes pinned layer 332, spacer layer 333 and free layer 334. In addition, in a preferred embodiment, an antiferromagnetic (AFM) layer 331 is used to pin the magnetization of the pinned layer 332. However, in another embodiment, another mechanism, such as a hard magnetic structure, may be used. The pinned layer 332 and free layer 334 may be ferromagnetic or ferrimagnetic. The pinned layer 332 may be a single layer or a multi-layer, including a synthetic pinned layer including at least two ferromagnetic layers separated by nonmagnetic spacer layers. Similarly, the free layer 334 may be a single layer or a multi-layer, including a synthetic pinned layer including at least two ferromagnetic layers separated by nonmagnetic spacer layers. The spacer layer 333 may be conductive, insulating, or a nano-oxide layer conducive to ballistic magnetoresistive. Thus, the magnetic element 330 may be a spin valve, a magnetic tunneling junction (MTJ) or other structure.

FIG. 26 is a magnetic element 330' that is a dual structure. Thus, the magnetic element 330' may include layers 331', 332', 333', and 334' that may be analogous to the layers 331, 332, 333, and 334 of the magnetic element 330. The magnetic element 330' also includes an additional spacer layer 335 and an additional pinned layer 336. In addition, in a preferred embodiment, an AFM layer 337 is used to pin the magnetization of the pinned layer 336. However, in another embodiment, another mechanism, such as a hard magnetic structure, may be used. The pinned layer 336 may be ferromagnetic or ferrimagnetic. The pinned layer 336 may be a single layer or a multi-layer, including a synthetic pinned layer including at least two ferromagnetic layers separated by nonmagnetic spacer layers. The spacer layer 335 may be conductive, insulating, or a nano-oxide layer conducive to ballistic magnetoresistive. Thus, the magnetic element 330' may be a dual spin valve, a dual MTJ or other structure.

Figure 27:
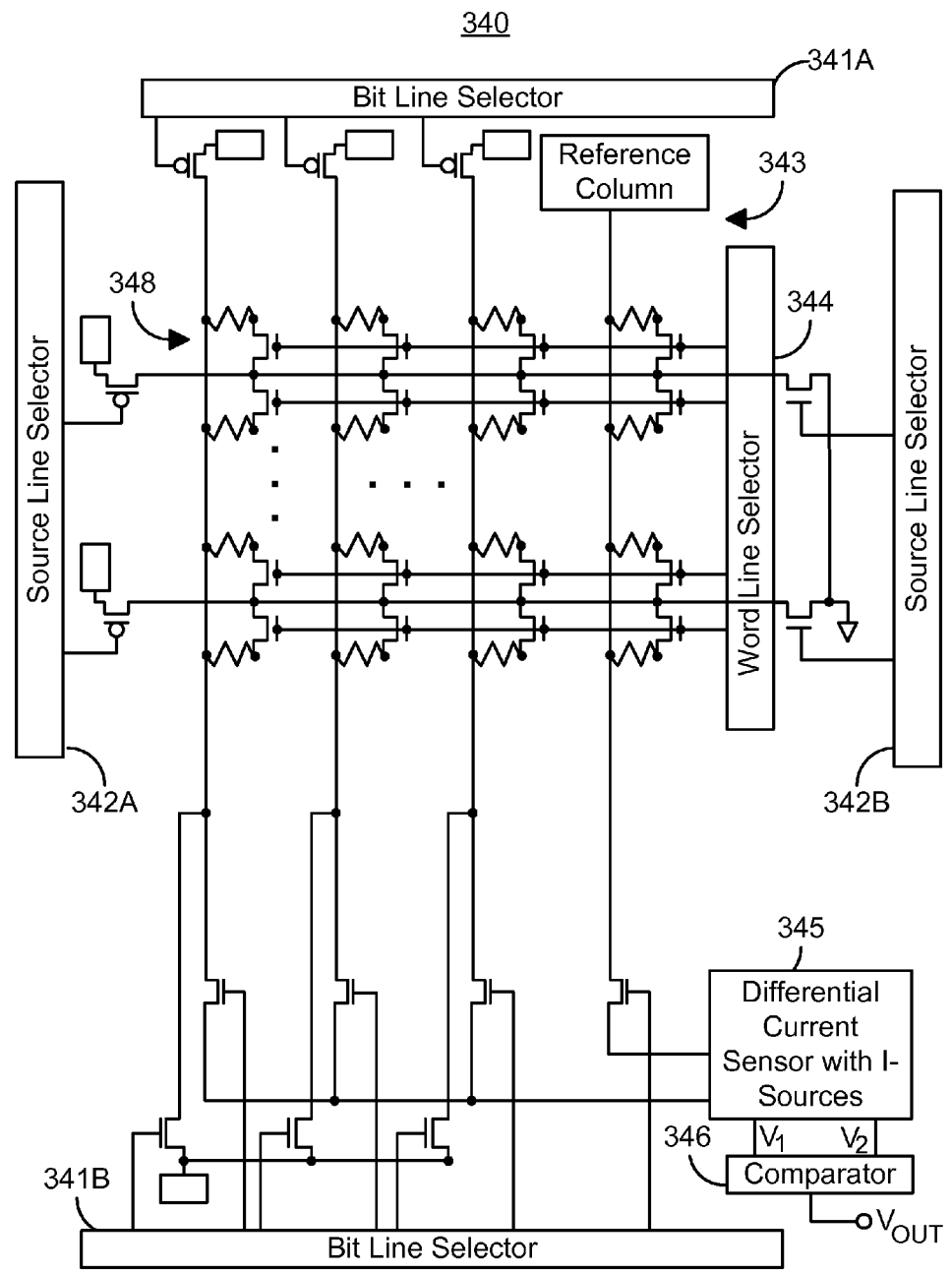
FIGS. 27-29 are diagrams of exemplary embodiments of magnetic memories employing the spin transfer effect and non-planar transistors.
Figure 28:
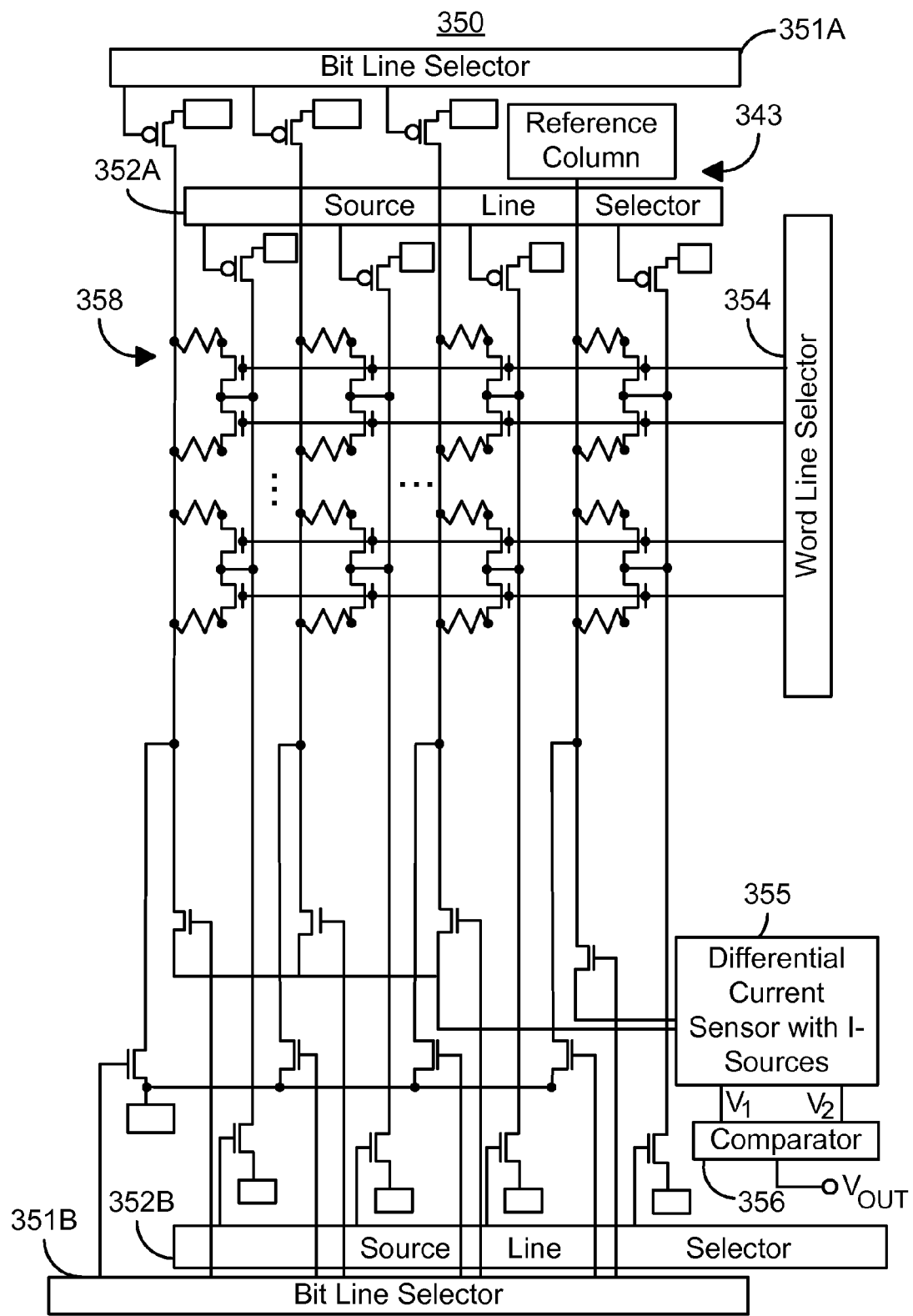
Figure 29:
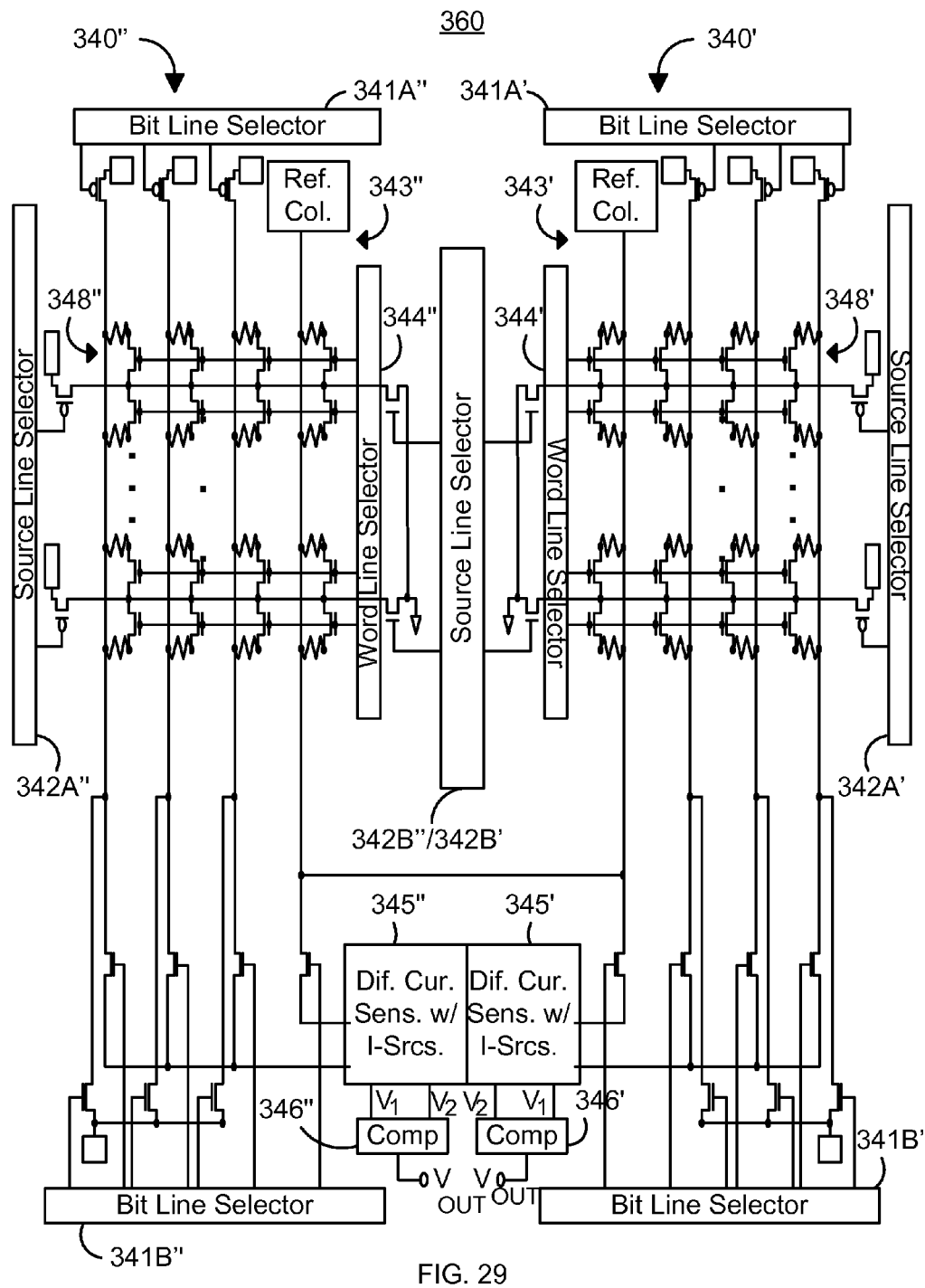

FIGS. 27-29 are diagrams of exemplary embodiments of magnetic memories 340, 350, and 360 employing the spin transfer effect. The memories 340, 350, and/or 360 may be used in a memory chip to form a memory chip product along with other circuits, such as including but not limited to address path and data path circuits (not shown), read and write control circuits (not shown), read and write current drivers (not shown), pre-decoder and decoders (not shown), and sense amplifiers (not shown).

FIG. 27 depicts the magnetic memory 340. The magnetic memory 340 includes bit line selectors 341A and 341B, source line selectors 342A and 342B, reference column 343, word line selector 344, differential current sensor with current source 345, comparator 346, and memory cells 348. The memory cells 348 are preferably arranged in an array of rows and columns. Note that some portion (not separately depicted) of the memory cells 348 may include spare and/or redundant columns and/or rows and corresponding circuits. Such spare memory cells 348 and circuitry may be used to identify bad bits and replace these bits with redundant bits in either redundant columns or rows. The array of memory cells may also include extra columns having memory cells that serve as checker bits for error code correction operation. These extra bits work with error correction circuits to make error correction work to insure correct data output of the memory. Thus, in the memory 340, the bit lines are perpendicular to the source lines. The memory cells 348 preferably correspond to one or more of the memory cells 110, 120, 130, 140, 150, 160, 170, 180, 190, 200, 210, 220, 230, 240, 250, 260, 270, 280, 290, 300, 310 and/or 320. Thus, the memory cells 348 may employ a non-planar selection device and a magnetic element that may be written using the spin transfer effect. The bit line selectors 341A and 341B select the column (s) of memory cells 348 through which a read and/or write current may is driven. The source line selectors 342A and 342B and word line selector 344, which enables the appropriate row of cells 348, may select the row(s) of cells to be read or written. The differential current sensor with current sources 345 may be used to drive a current through the appropriate cell(s) 348. The comparator 346 may be used to compare the signal with an output from the reference column 343. Consequently, the desired cell(s) 348 may be read and written in the memory 340. In addition, because the memory cells 348 preferably correspond to one or more of the memory cells 110, 120, 130, 140, 150, 160, 170, 180, 190, 200, 210, 220, 230, 240, 250, 260, 270, 280, 290, 300, 310 and/or 320, the advantages of the memory cells 348 may be achieved. In particular, improved performance at higher densities may be achieved.

FIG. 28 depicts the magnetic memory 350, which includes bit line selectors 351A and 351B, source line selectors 352A and 352B, reference column 353, word line selector 354, differential current sensor with current source 355, comparator 356, and memory cells 358. The memory cells 358 are preferably arranged in an array of rows and columns. Note that some portion (not separately depicted) of the memory cells 358 may include spare and/or redundant columns and/or rows and corresponding circuits. Such spare memory cells 358 and circuitry may be used to identify bad bits and replace these bits with redundant bits in either redundant columns or rows. The array of memory cells may also include extra columns having memory cells that serve as checker bits for error code correction operation. These extra bits work with error correction circuits to make error correction work to insure correct data output of the memory. In the memory 350, the bit lines are parallel to the source lines. The memory cells 358 preferably correspond to one or more of the memory cells 110, 120, 130, 140, 150, 160, 170, 180, 190, 200, 210, 220, 230, 240, 250, 260, 270, 280, 290, 300, 310 and/or 320. Thus, the memory cells 358 may employ a non-planar selection device and a magnetic element that may be written using the spin transfer effect. The bit line selectors 351A and 351B and the source line selectors 352A and 352B select the column(s) of memory cells 358 through which a read and/or write current is driven. The word line selector 354, which enables the appropriate row of cells 358, may select the row(s) of cells to be read or written. The differential current sensor with current sources 355 may be used to drive a current through the appropriate cell(s) 358. The comparator 356 may be used to compare the signal with an output from the reference column 353. Consequently, the desired cell(s) 358 may be read and written in the memory 350. In addition, because the memory cells 358 preferably correspond to one or more of the memory cells 110, 120, 130, 140, 150, 160, 170, 180, 190, 200, 210, 220, 230, 240, 250, 260, 270, 280, 290, 300, 310 and/or 320, the advantages of the memory cells 358 may be achieved. In particular, improved performance at higher densities may be achieved.

FIG. 29 depicts the magnetic memory 360, which includes sectors 340' and 340" that correspond to the memory 340. Consequently, the components of the sectors 340' and 340" are labeled in a similar manner to the memory 340. For example, the sectors 340' and 340" include memory cells 348' and 348". However, one source line selector from each sector 340' and 340" is merged to a single source line selector 342B"/342B'. The magnetic memory 360 thus enjoys many of the advantages of the magnetic memory 340. In particular, improved performance at higher densities may be achieved. In one embodiment, the magnetic memory cell 348'/348" may be read using an average mid-point current reference scheme. The average mid point reference scheme sets the magnetic storage cells 348'/348" for the two reference columns 343' and 343" in opposite states. The signal from a magnetic storage cell 348'/348" may be measured against the average of the reference columns 343'/343".

Figure 30:
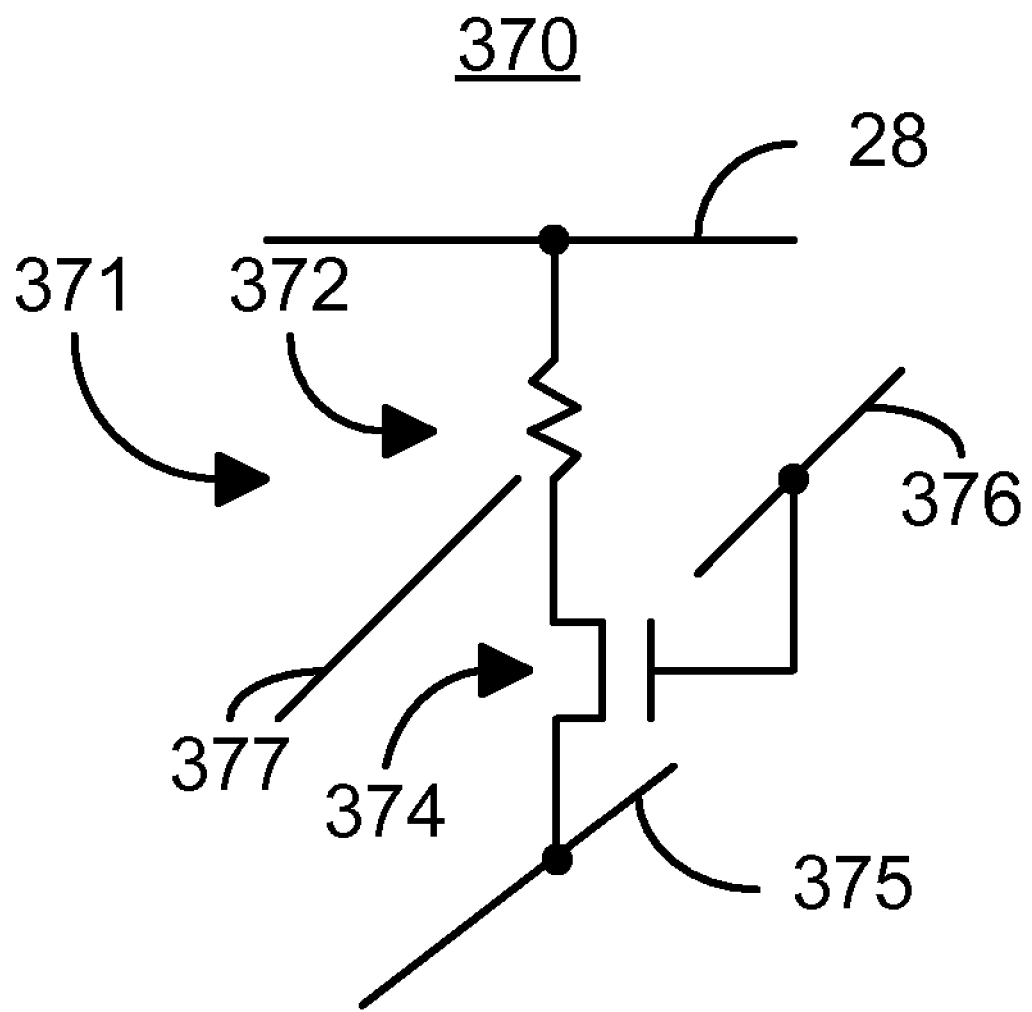
FIGS. 30-31 are diagrams of exemplary embodiments of magnetic memories employing magnetic field assisted spin transfer effect and non-planar transistors.
Figure 31:
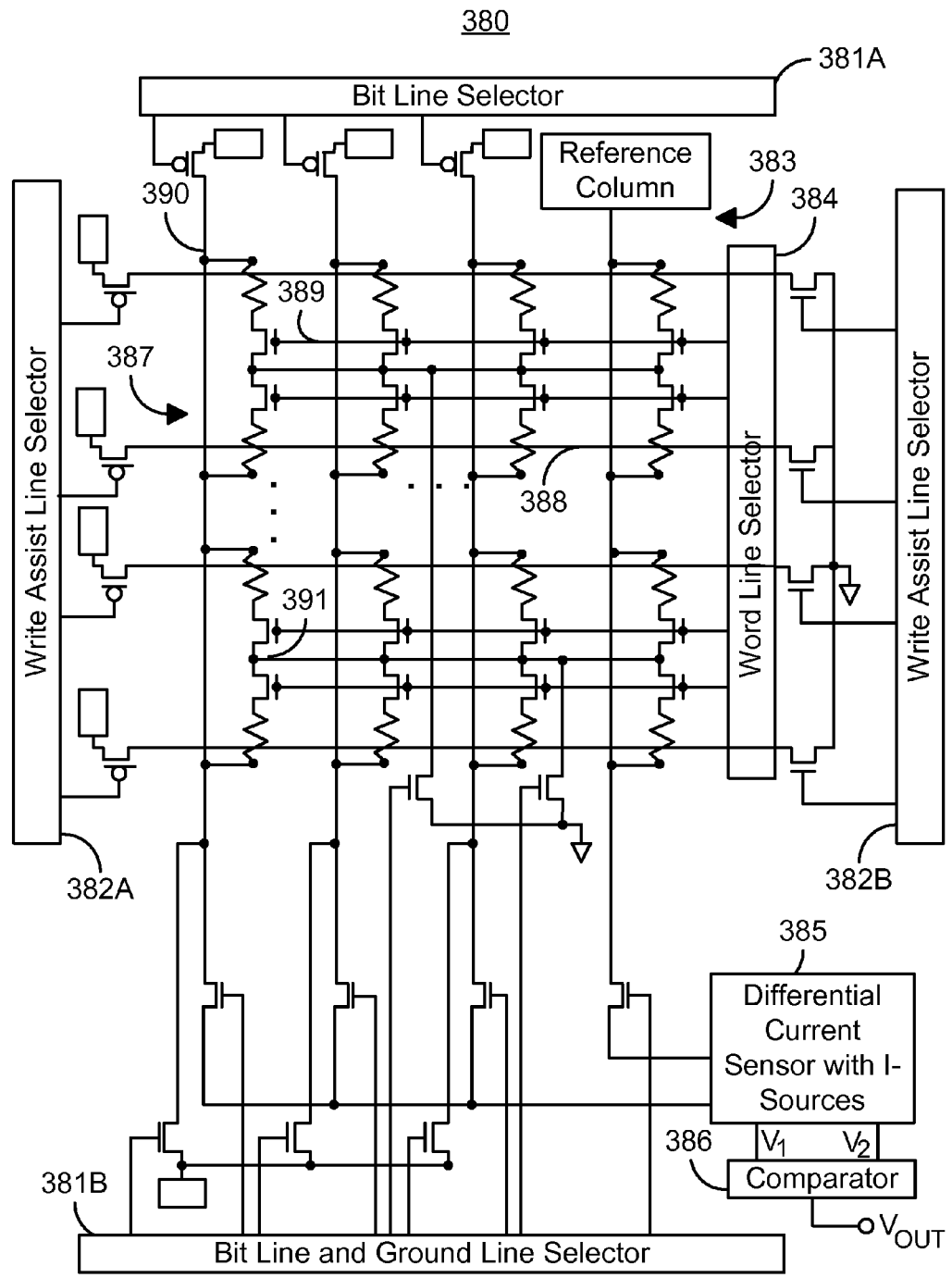

FIGS. 30-31 are diagrams of other exemplary embodiments of magnetic memories 370 and 380, respectively, employing magnetic field assisted spin transfer effect and non-planar transistors. The memories 370 and/or 380 may be used in a memory chip to form a memory chip product along with other circuits, such as including but not limited to address path and data path circuits (not shown), read and write control circuits (not shown), read and write current drivers (not shown), pre-decoder and decoders (not shown), and sense amplifiers (not shown). FIG. 30 includes a magnetic storage cell 371 of a memory 370. The magnetic storage cell 371 includes at least one magnetic element 372 and a non-planar selection device 374. The magnetic element 372 may be analogous to the magnetic element(s) 112, 122, 132, 142, 152, 162, 172, 182, 192, 202, 212, 222, 232, 242, 252, 262, 272, 282, 292, 302, 312 and/or 322. Similarly, the non-planar selection device 374 may be analogous to the non-planar selection device(s) 114, 124, 134, 144, 154, 164, 174, 184, 194, 204, 214, 224, 234, 244, 254, 264, 274, 284, 294, 304, 314 and/or 324. The magnetic memory 370 also includes word line 376, source line 375, and write assist line 377.

In operation, the magnetic storage cell 371 is written using a combination of spin transfer and a magnetic field generated by a current driven through the write assist line 377. Thus, in a write operation, current is driven through the magnetic element 372 in a CPP configuration and the magnetic element 372 is subjected to a magnetic field. In one embodiment, the magnetic field may be unidirectional while the current may be bidirectional (up or down in FIG. 30). However, in another embodiment, the current may be unidirectional while the magnetic field is bidirectional. Because both a write current and a magnetic field are used, the current driven through the magnetic element 372, and thus the non-planar transistor may be smaller. Consequently, the magnetic memory 370 may be more easily scaled to smaller dimensions.

FIG. 31 depicts a magnetic memory 380 of which the magnetic memory 370 may be a part. The magnetic memory 380 includes bit line selector 381A, bit and ground line selector 381B, write assist line selectors 382A and 382B, reference column 383, word line selector 384, differential current sensor with current sources 385, comparator 386, magnetic memory cells 387, write assist lines 388, bit lines 390, and source lines 391. Thus, the memory cells 387 may employ a non-planar selection device 374 and a magnetic element 372 that may be written using a combination of the spin transfer effect and an applied magnetic field.

The memory cells 387 are preferably arranged in an array of rows and columns. Note that some portion (not separately depicted) of the memory cells 387 may include spare and/or redundant columns and/or rows and corresponding circuits. Such spare memory cells 387 and circuitry may be used to identify bad bits and replace these bits with redundant bits in either redundant columns or rows. The array of memory cells 387 may also include extra columns having memory cells that serve as checker bits for error code correction operation. These extra bits work with error correction circuits to make error correction work to insure correct data output of the memory.

In the memory 380, the bit lines are perpendicular to the source lines 391. The bit line selectors 381A and bit line and ground line selector 381B, word lines selector 384, and write assist line selectors 382A and 382B effectively select the memory cells 387 to be read or written. The differential current sensor with current sources 385 may be used to drive a read current through the appropriate cell(s) 385. The comparator 385 may be used to compare the signal with an output from the reference column 383. Consequently, the desired cell(s) 387 may be read and written in the memory 350. In addition, because the memory cells 387 preferably correspond to the memory cell 371, and thus the memory cells 110, 120, 130, 140, 150, 160, 170, 180, 190, 200, 210, 220, 230, 240, 250, 260, 270, 280, 290, 300, 310 and/or 320, the advantages of the memory cells 370 may be achieved. In particular, improved performance at higher densities may be achieved.

Figure 32:
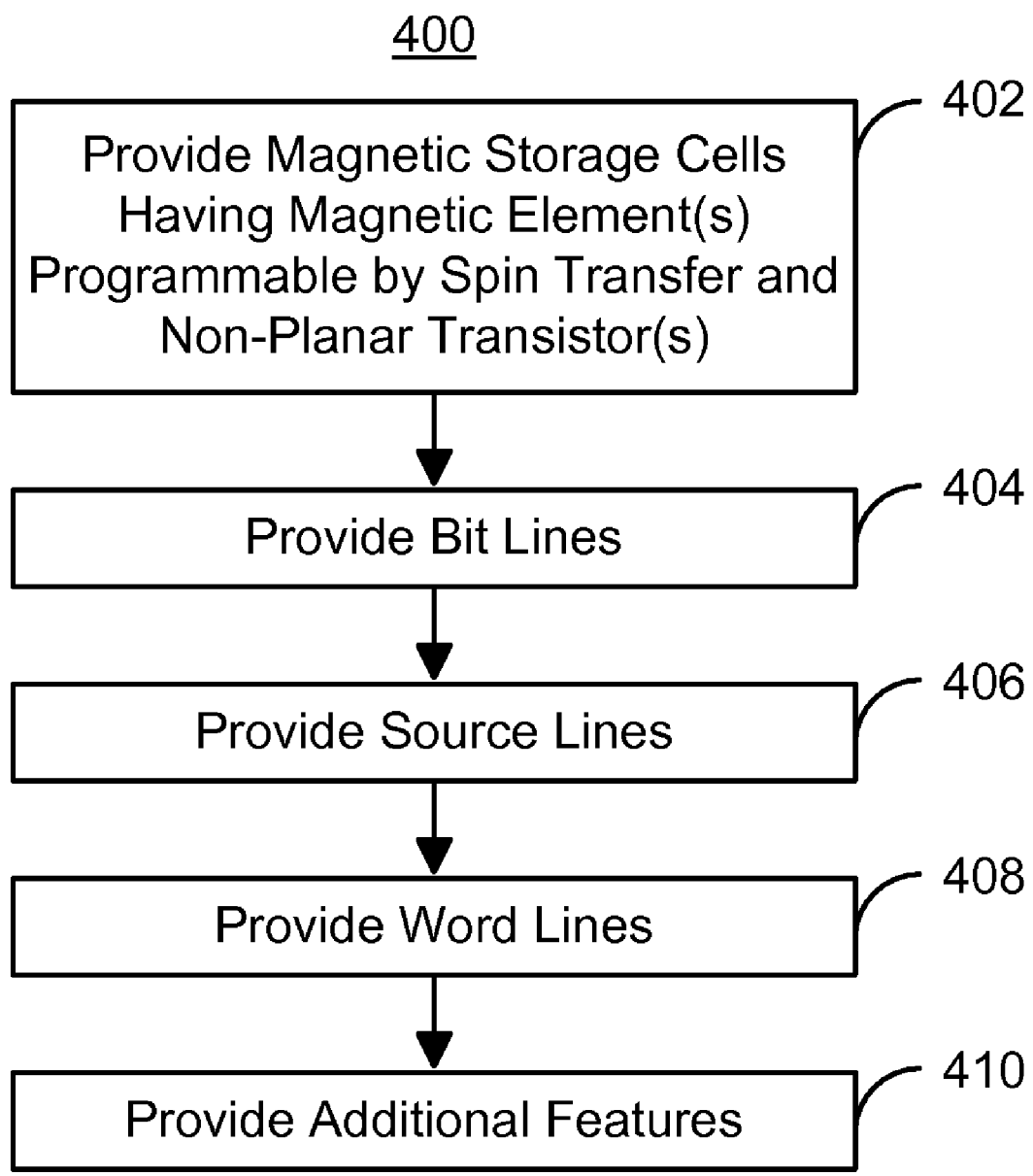
FIG. 32 is a diagram of an exemplary embodiment of a method for providing a magnetic memory employing the spin transfer effect and non-planar transistors.

FIG. 32 is a diagram of an exemplary embodiment of a method 400 for providing a magnetic memory employing the spin transfer effect. A plurality of magnetic storage cells 110, 120, 130, 140, 150, 160, 170, 180, 190, 200, 210, 220, 230, 240, 250, 260, 270, 280, 290, 300, 310 and/or 320 are provided, via step 402. Each of the plurality of magnetic storage cells 110, 120, 130, 140, 150, 160, 170, 180, 190, 200, 210, 220, 230, 240, 250, 260, 270, 280, 290, 300, 310 and/or 320 provided in step 402 includes at least one magnetic element 112, 122, 132, 142, 152, 162, 172, 182, 192, 202, 212, 222, 232, 242, 252, 262, 272, 282, 292, 302, 312 and/or 322, respectively, and at least one non-planar selection device 114, 124, 134, 144, 154, 164, 174, 184, 194, 204, 214, 224, 234, 244, 254, 264, 274, 284, 294, 304, 314 and/or 324, respectively. The magnetic element(s) 112, 122, 132, 142, 152, 162, 172, 182, 192, 202, 212, 222, 232, 242, 252, 262, 272, 282, 292, 302, 312 and/or 322 is programmable using at least one write current driven through the magnetic element. The bit lines corresponding to the plurality of magnetic storage cells 110, 120, 130, 140, 150, 160, 170, 180, 190, 200, 210, 220, 230, 240, 250, 260, 270, 280, 290, 300, 310 and/or 320 are provided, via step 404. The plurality of source lines corresponding to the plurality of magnetic storage cells 110, 120, 130, 140, 150, 160, 170, 180, 190, 200, 210, 220, 230, 240, 250, 260, 270, 280, 290, 300, 310 and/or 320 are provided, via step 406. The word lines coupled with the one non-planar selection device(s) 114, 124, 134, 144, 154, 164, 174, 184, 194, 204, 214, 224, 234, 244, 254, 264, 274, 284, 294, 304, 314 and/or 324 are provided, via step 408. Any additional components, such as logic 341A, 341B, 342A, 342B, 343, 344, 345, 346, 351A, 351B, 352A, 352B, 353, 354, 355, 356, 341A', 341A", 341B, 341B", 342A', 3424A", 342B'/342B", 344', 344", 345', 345", 346', 346", 381A, 381B, 382A, 382B, 384, 385, and 386, as well as write assist lines 388 may be provided in step 410 are provided, via step 410. Thus, using the method 400, magnetic memories having the benefits of the memory cells 110, 120, 130, 140, 150, 160, 170, 180, 190, 200, 210, 220, 230, 240, 250, 260, 270, 280, 290, 300, 310 and/or 320 may be provided.

A method and system for providing a magnetic memory has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory cell comprising:
   at least one magnetic element, the at least one magnetic element being programmable using at least one write current driven through the magnetic element; and
   at least one non-planar selection device coupled with the at least one magnetic element.

2. The magnetic memory cell of claim 1 wherein the at least one non-planar selection device further includes a non-planar transistor.

3. The magnetic memory cell of claim 2 wherein the non-planar transistor includes at least one of a multiple gate transistor; a silicon on oxide (SOI) transistor, a type of Fin field effect transistor (FinFET), a multiple-gate SOI transistor, a nanowire transistor, a (carbon) nanotube transistor, a delta transistor, a folded channel transistor, a triangular wire transistor, a vertical channel transistor, a vertical-source planar gate transistor, and a round-gate transistor.

4. A magnetic memory comprising:
   a plurality of magnetic storage cells, each of the plurality of magnetic storage cells including at least one magnetic element and at least one non-planar selection device, the at least one magnetic element being programmable using at least one write current driven through the magnetic element;
   a plurality of bit lines corresponding to the plurality of magnetic storage cells; and
   a plurality of source lines corresponding to the plurality of magnetic storage cells.

5. The magnetic memory of claim 4 wherein the at least one non-planar selection device further includes a non-planar transistor.

6. The magnetic memory of claim 5 wherein the non-planar transistor includes at least one of a multiple gate transistor; a silicon on oxide (SOI) transistor, a type of Fin field effect transistor (FinFET), a multiple-gate SOI transistor, a nanowire transistor, a (carbon) nanotube transistor, a delta transistor, a folded channel transistor, a triangular wire transistor, a vertical channel transistor, a vertical-source planar gate transistor, and a round-gate transistor.

7. The magnetic memory of claim 5 wherein the at least one magnetic element includes at least one pinned layer, at least one spacer layer, and at least one free layer, the at least one spacer layer residing between the at least one pinned layer and the at least one free layer.

8. The magnetic memory of claim 7 wherein the at least one spacer layer includes at least one insulator configured to allow tunneling of charge carriers through the at least one insulator.

9. The magnetic memory of claim 8 wherein the at least one magnetic element includes a magnetic tunneling junction.

10. The magnetic memory of claim 8 wherein the at least one magnetic element includes at least one dual magnetic tunneling junction.

11. The magnetic memory of claim 4 further comprising:
   a plurality of write assist lines corresponding to the plurality of magnetic storage cells, the plurality of write assist lines for providing a magnetic field during a write of at least a portion of the plurality of magnetic memory cells.

12. A magnetic memory comprising:
   a plurality of magnetic storage cells, each of the plurality of magnetic storage cells including at least one magnetic element and at least one non-planar transistor, the at least one magnetic element being programmable using at least one write current driven through the magnetic element;
   a plurality of bit lines corresponding to the plurality of magnetic storage cells; providing and
   a plurality of source lines corresponding to the plurality of magnetic storage cells;
   wherein the non-planar transistor includes at least one of a multiple gate transistor;
   a silicon on oxide (SOI) transistor, a type of Fin field effect transistor (FinFET), a multiple-gate SOI transistor, a nanowire transistor, a (carbon) nanotube transistor, a delta transistor, a folded channel transistor, a triangular wire transistor, a vertical channel transistor, a vertical-source planar gate transistor, and a round-gate transistor.

13. The magnetic memory of claim 12 further comprising:
a plurality of write assist lines corresponding to the plurality of magnetic storage cells, the plurality of write assist lines for providing a magnetic field during a write of at least a portion of the plurality of magnetic memory cells.

14. A method for fabricating a magnetic memory comprising:
providing a plurality of magnetic storage cells, each of the plurality of magnetic storage cells including at least one magnetic element and at least one non-planar selection device, the at least one magnetic element being programmable using at least one write current driven through the magnetic element;
providing a plurality of bit lines corresponding to the plurality of magnetic storage cells; providing and
providing a plurality of source lines corresponding to the plurality of magnetic storage cells.

15. The method of claim 14 wherein the at least one non-planar selection device further includes a non-planar transistor.

16. The method of claim 15 wherein the non-planar transistor includes at least one of a multiple gate transistor; a silicon on oxide (SOI) transistor, a type of Fin field effect transistor (FinFET), a multiple-gate SOI transistor, a nanowire transistor, a (carbon) nanotube transistor, a delta transistor, a folded channel transistor, a triangular wire transistor, a vertical channel transistor, a vertical-source planar gate transistor, and a round-gate transistor.

17. The method of claim 14 wherein the at least one magnetic element includes at least one pinned layer, at least one spacer layer, and at least one free layer, the at least one spacer layer residing between the at least one pinned layer and the at least one free layer.

18. The method of claim 17 wherein the at least one spacer layer includes at least one insulator configured to allow tunneling of charge carriers through the at least one insulator.

19. The method of claim 17 wherein the at least one magnetic element includes at least one of a magnetic tunneling junction and a dual magnetic tunneling junction.

20. The method of claim 14 further comprising:
providing a plurality of write assist lines corresponding to the plurality of magnetic storage cells, the plurality of write assist lines for providing a magnetic field during a write of at least a portion of the plurality of magnetic memory cells.

* * * * *